(12) United States Patent
Park et al.

(10) Patent No.: US 12,433,121 B2
(45) Date of Patent: Sep. 30, 2025

(54) DISPLAY DEVICE AND METHOD OF MANUFACTURING THE SAME

(71) Applicant: Samsung Display Co., Ltd., Yongin-si (KR)

(72) Inventors: Jongjang Park, Yongin-si (KR); Seoksoon Back, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 594 days.

(21) Appl. No.: 17/865,392

(22) Filed: Jul. 15, 2022

(65) Prior Publication Data
US 2023/0019185 A1    Jan. 19, 2023

(30) Foreign Application Priority Data
Jul. 16, 2021   (KR) ........................ 10-2021-0093691

(51) Int. Cl.
| | |
|---|---|
| H01L 27/32 | (2006.01) |
| H10K 59/122 | (2023.01) |
| H10K 59/131 | (2023.01) |
| H10K 59/12 | (2023.01) |
| H10K 71/00 | (2023.01) |

(52) U.S. Cl.
CPC ....... *H10K 59/1315* (2023.02); *H10K 59/122* (2023.02); *H10K 59/1201* (2023.02); *H10K 71/00* (2023.02)

(58) Field of Classification Search
None
See application file for complete search history.

(56) References Cited

U.S. PATENT DOCUMENTS

| | | | |
|---|---|---|---|
| 9,780,158 B2 | 10/2017 | Lee et al. | |
| 10,186,680 B2 | 1/2019 | Lee | |
| 10,497,763 B2* | 12/2019 | Paek | H10K 59/122 |
| 12,219,859 B2* | 2/2025 | Zheng | H10K 59/122 |
| 2009/0050879 A1* | 2/2009 | Yamaga | H10K 71/611 |
| | | | 257/40 |
| 2011/0039362 A1* | 2/2011 | Long | H10D 86/0241 |
| | | | 257/E21.414 |
| 2011/0111599 A1* | 5/2011 | Lennon | H01L 21/31111 |
| | | | 257/E21.486 |
| 2012/0199870 A1* | 8/2012 | Kang | H10K 50/814 |
| | | | 257/E33.062 |

FOREIGN PATENT DOCUMENTS

| | | |
|---|---|---|
| KR | 10-0626051 | 9/2006 |
| KR | 10-0728889 | 6/2007 |
| KR | 10-2012-0090595 | 8/2012 |
| KR | 10-2016-0037369 | 4/2016 |
| KR | 10-2018-0104225 | 9/2018 |
| KR | 10-2020-0039249 | 4/2020 |

\* cited by examiner

*Primary Examiner* — William C Trapanese
(74) *Attorney, Agent, or Firm* — Lerner David LLP

(57) ABSTRACT

A display device and a method of manufacturing the display device. An auxiliary electrode may be connected to a counter electrode without damaging a light-emitting element because a laser is not used.

20 Claims, 15 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2021-0093691, filed on Jul. 16, 2021, which is hereby incorporated by reference for all purposes as if fully set forth herein.

BACKGROUND

Field

Embodiments of the invention relate generally to apparatuses and methods, and more specifically, to display devices and methods of manufacturing the display devices.

Discussion of the Background

Electronic devices based on mobility are widely used. In addition to compact electronic devices such as mobile phones, recently, tablet PCs are widely used as mobile electronic devices.

To support various functions, such mobile electronic devices include display devices for providing a user with visual information, such as an image or a video. As other components to drive a display device are miniaturized, the size of the portion of a display device in an electronic device gradually increases, and a structure to enable bending at a certain angle from a flat state is under development.

The above information disclosed in this Background section is only for understanding of the background of the inventive concepts, and, therefore, it may contain information that does not constitute prior art.

SUMMARY

An auxiliary electrode is connected to a counter electrode and prevents a voltage drop of the counter electrode. In this regard, the method of connecting the auxiliary electrode to the counter electrode is quite important, and thus various methods may be used for this purpose. One or more embodiments include display devices in which a connection between a counter electrode and an auxiliary electrode may be achieved by a simple and quick method and which prevent a voltage drop of the counter electrode, and methods of manufacturing the display devices.

Additional aspects will be set forth in part in the description which follows and, in part, will be apparent from the description, or may be learned by practice of the presented embodiments of the inventive concepts.

An embodiment of the invention provides a display device including a substrate, a first electrode arranged on the substrate, an auxiliary layer arranged on the first electrode, an auxiliary electrode arranged on the substrate to be apart from the first electrode, a second electrode arranged on the auxiliary layer and the auxiliary electrode and connected to the auxiliary electrode, and a bridge portion arranged on the auxiliary electrode and connecting the auxiliary electrode to the second electrode, wherein the auxiliary layer is arranged on the bridge portion.

The auxiliary layer may be arranged on the entire surface of the substrate.

The second electrode may be arranged on the entire surface of the substrate.

The display device may further include a pixel defining layer arranged on the substrate, the first electrode, and the auxiliary electrode and including an opening portion that exposes each of the first electrode and the auxiliary electrode to the outside.

The bridge portion may include at least one of silver (Ag), aluminum (Al), or copper (Cu).

Another embodiment of the invention provides a method of manufacturing a display device including forming a first electrode and an auxiliary electrode on a substrate, forming a pixel defining layer on the first electrode and the auxiliary electrode to expose at least part of the first electrode and at least part of the auxiliary electrode on the substrate to the outside, forming an auxiliary layer on the pixel defining layer, the auxiliary electrode, and the first electrode, and removing the auxiliary layer arranged on the auxiliary electrode by supplying an etchant, in an inkjet printing method, to the auxiliary layer arranged on the auxiliary electrode.

The etchant may include hydrogen peroxide and/or sulfuric acid.

The method may further include drying the etchant.

The method may further include removing the etchant by sucking.

The method may further include forming an opening portion in the pixel defining layer to expose the at least part of the first electrode and the at least part of the auxiliary electrode to the outside.

The method may further include arranging a blocking member on the auxiliary layer except the auxiliary layer arranged on the auxiliary electrode.

The method may further include forming a second electrode on the auxiliary layer to connect the second electrode to the auxiliary electrode.

The second electrode may be formed on the entire surface of the substrate.

Another embodiment of the invention provides a method of manufacturing a display device including forming a first electrode and an auxiliary electrode on a substrate, forming a pixel defining layer on the first electrode and the auxiliary electrode to expose at least part of the first electrode and at least part of the auxiliary electrode on the substrate to the outside, forming an auxiliary layer on the pixel defining layer, the auxiliary electrode, and the first electrode, and forming a bridge portion that penetrate the auxiliary layer arranged on the auxiliary electrode to be connected to the first electrode by supplying metal ink, in an inkjet printing method, to the auxiliary layer arranged on the auxiliary electrode.

The method may further include forming an opening portion in the pixel defining layer to expose the at least part of the first electrode and the at least part of the auxiliary electrode to the outside.

The method may further include arranging a blocking member on the auxiliary layer except the auxiliary layer arranged on the auxiliary electrode.

The method may further include forming a second electrode on the auxiliary layer to connect the second electrode to the bridge portion.

The second electrode may be formed on the entire surface of the substrate.

The metal ink may include a metal particle, and a solvent in which the metal particle is arranged.

The metal particle may include at least one of silver (Ag), aluminum (Al), or copper (Cu).

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
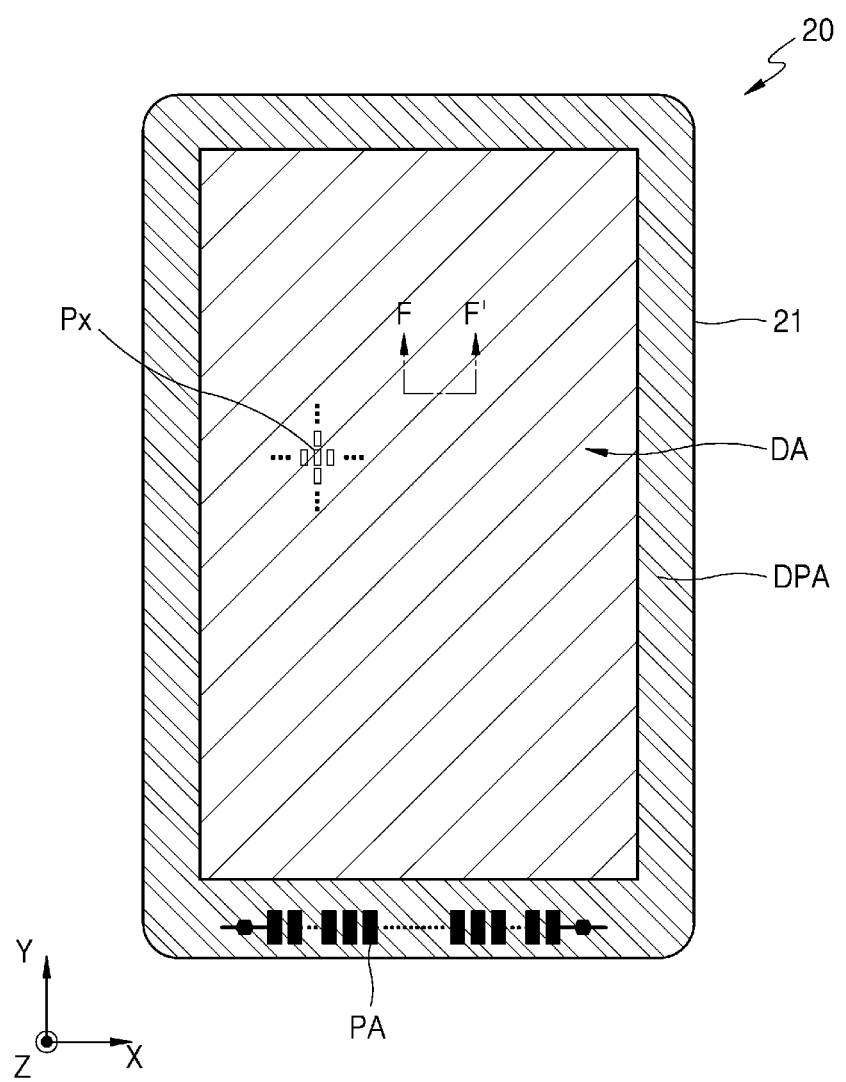
FIG. 1 is a plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
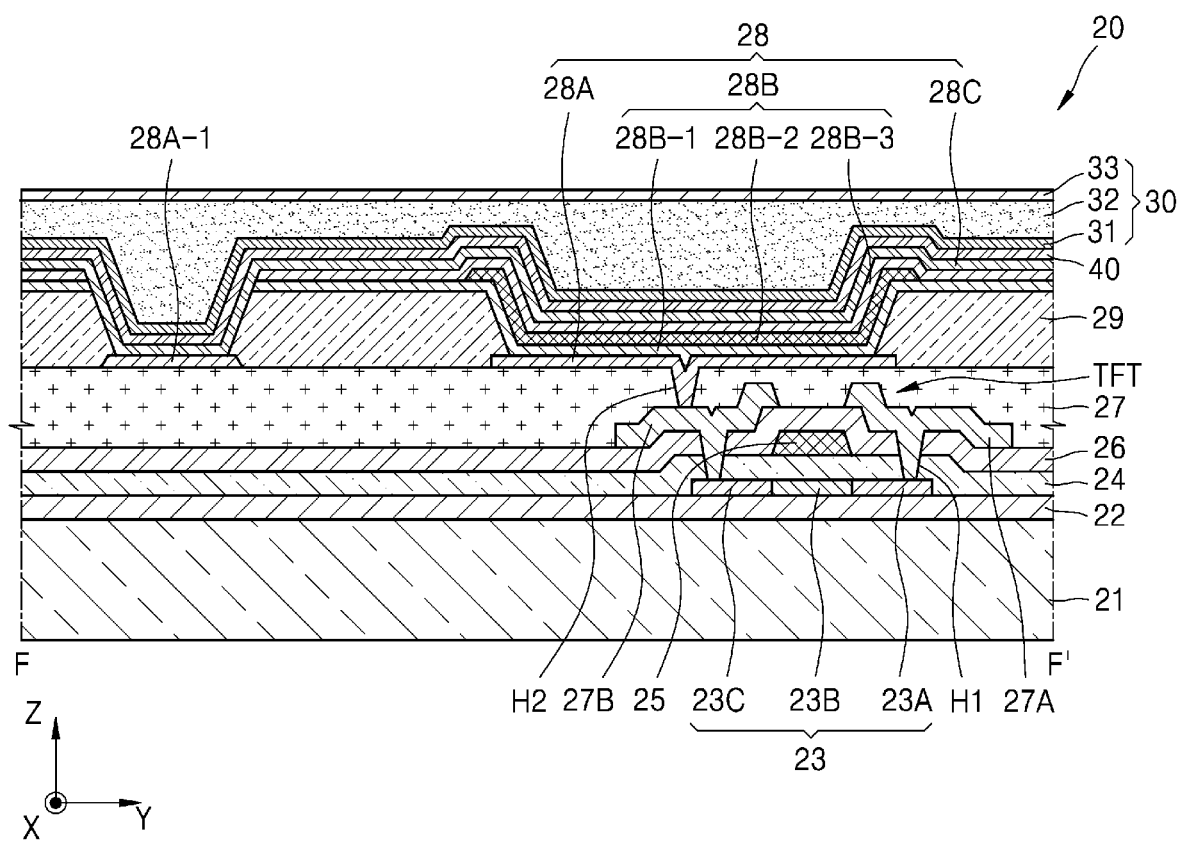
FIG. 2 is a cross-sectional view of the display device taken along line F-F' of FIG.

FIG. 1 is a plan view of a display device 20 according to an embodiment. FIG. 2 is a cross-sectional view of the display device 20 taken along line F-F' of FIG. 1.

Referring to FIGS. 1 and 2, the display device 20 is a light-emitting display device including a light-emitting element. For example, the display device 20 may include organic light-emitting display devices using organic light-emitting diodes including organic emission layers, micro light-emitting diode (LED) display devices using micro LEDs, quantum dot light-emitting display devices using quantum dot light-emitting diodes including quantum dot light-emitting layers, or inorganic light-emitting display devices using inorganic light-emitting elements including inorganic semiconductors.

The display device 20 may be a rigid display device having stiffness so as not to be easily bent, or a flexible display device having flexibility so as to be easily bent, folded, or rolled. For example, the display device 20 may be a foldable display device that is foldable and unfoldable, a curved display device having a bent display surface, a bended display device that is bent in an area other than a display surface, a rollable display device that is rollable and unrollable, or a stretchable display device that is stretchable and compressible.

The display device 20 may be a transparent display device that is implemented to be transparent so that an object or background located below a lower surface of the display device 20 is visible from an upper surface of the display device 20. Alternatively, the display device 20 may be a reflective display device that is capable of reflecting an object or background above the upper surface of the display device 20.

The display device 20 may include a display area DA and a peripheral area DPA outside the display area DA, which are defined on a substrate 21. A pixel Px may be arranged in the display area DA, and a power wiring (not shown) and the like may be arranged in the peripheral area DPA. Furthermore, a pad portion PA may be arranged in the peripheral area DPA.

The display device 20 may include a display layer (not shown) arranged on the substrate 21. In this state, a sealing member of the display layer may include a sealing portion arranged on the substrate 21 and an encapsulation substrate (not shown) connected to the sealing portion and arranged to face the substrate 21. In another embodiment, the sealing member of the display layer may include a thin film encapsulation layer E that shields at least part of the display layer. In the following description, for convenience of explanation, a case in which the sealing member includes a thin film encapsulation layer 30 is mainly described in detail.

The substrate 21 may include an insulating material, such as glass, quartz, polymer resin, or the like. The substrate 21 may be a rigid substrate or a flexible substrate capable of bending, folding, rolling, and the like. For example, the substrate 21 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 21 may have a multilayer structure including a layer including the above-described polymer resin and an inorganic layer (not shown). For example, the substrate 21 may include two layers including the above-described polymer resin and an inorganic barrier layer therebetween.

The display layer may include a thin film transistor (TFT) arranged on the substrate 21 and an organic light-emitting element (OLED) 28.

The TFT may be formed on the substrate 21, a passivation film 27 may be formed to cover the TFT, and the OLED 28 may be formed on the passivation film 27.

A buffer layer 22 including an organic compound and/or an inorganic compound may be further arranged on an upper surface of the substrate 21. For example, the buffer layer 22 may include $SiO_x$ (x≥1) and/or $SiN_x$ (x≥1).

An active layer 23 arranged in a specific pattern may be formed on the buffer layer 22, and then the active layer 23 may be buried by a gate insulating layer 24. The active layer 23 may further include a source region 23A and a drain region 23C, and a channel region 23B therebetween.

The active layer 23 may include various materials. For example, the active layer 23 may include an inorganic semiconductor material such as amorphous silicon or crystalline silicon. In another example, the active layer 23 may include an oxide semiconductor. In another example, the active layer 23 may include an organic semiconductor material.

In the active layer 23, the source region 23A and the drain region 23C may be doped with impurities according to the type of TFTs such as a driving TFT (not shown), a switching TFT (not shown), and the like.

A gate electrode 25 corresponding to the active layer 23 and an interlayer insulating layer 26 for burying the gate electrode 25 are formed on an upper surface of the gate insulating layer 24.

After a contact hole H1 is formed in the interlayer insulating layer 26 and the gate insulating layer 24, a source electrode 27A and a drain electrode 27B are formed on the interlayer insulating layer 26 to respectively contact the source region 23A and the drain region 23C.

The passivation film 27 may be formed above the TFT configured as above, and a pixel electrode 28A of the OLED 28 may be formed above the passivation film 27. The pixel electrode 28A may be in contact with the drain electrode 27B of the TFT through a via hole H2 formed in the passivation film 27. In another embodiment, the pixel electrode 28A may be in contact with the source electrode 27A. The passivation film 27 may be a single layer or two or more layers of an inorganic material and/or an organic material. An upper surface of the passivation film 27 may be formed as a planarized surface regardless of the curvature of a film thereunder, or formed to have a curvature according to the curvature of the film thereunder).

After forming the pixel electrode 28A on the passivation film 27, a pixel defining layer 29 may be formed of an organic material and/or inorganic material to cover the pixel electrode 28A and the passivation film 27, and may be opened such that the pixel electrode 28A is exposed through an opening area of the pixel defining layer 29.

The pixel electrode 28A may include a conductive oxide such as indium tin oxide (ITO), indium zinc oxide (IZO), zinc oxide (ZnO), indium oxide ($In_2O_3$), indium gallium oxide (IGO) or aluminum zinc oxide (AZO). The pixel electrode 28A may include a reflective film including silver (Ag), magnesium (Mg), aluminum (Al), platinum (Pt), palladium (Pd), gold (Au), nickel (Ni), neodymium (Nd), iridium (Ir), chromium (Cr), or compounds thereof. For example, the pixel electrode 28A may have a structure having films including ITO, IZO, ZnO, or $In_2O_3$ above/below the above-described reflective film. In this case, the pixel electrode 28A may have a stack structure of ITO/Ag/ITO.

An intermediate layer 28B and a counter electrode 28C may be formed on the pixel electrode 28A. The counter electrode 28C may be formed on the entire surface of the display area DA. In this case, the counter electrode 28C may be formed on the intermediate layer 28B and the pixel defining layer 29. In the following description, for convenience of explanation, a case in which the counter electrode 28C is formed on the intermediate layer 28B and the pixel defining layer 29 is described in detail.

The pixel electrode 28A functions as an anode electrode, and the counter electrode 28C functions as a cathode electrode. Also, the polarities of the pixel electrode 28A and the counter electrode 28C may be reversed.

The pixel electrode 28A and the counter electrode 28C are insulated from each other by the intermediate layer 28B, and an organic emission layer may emit light by applying a voltage of a different polarity to the intermediate layer 28B.

An auxiliary electrode 28A-1 may be arranged apart from the pixel electrode 28A. In this state, the auxiliary electrode 28A-1 may be formed on the passivation film 27. The auxiliary electrode 28A-1 may be formed of the same material as the pixel electrode 28A in the same process and may include the same material as the pixel electrode 28A. The auxiliary electrode 28A-1 may be in contact with the counter electrode 28C. The auxiliary electrode 28A-1 may be in contact with the counter electrode 28C via a contact hole formed in a first auxiliary layer 28B-1 and a second auxiliary layer 28B-3. Accordingly, the generation of IR drop may be reduced by decreasing the resistance of the counter electrode 28C. In other words, when the counter electrode 28C is formed to be thin, the resistance of the counter electrode 28C may be increased, and thus, the generation of IR drop may be increased. In this case, by connecting the auxiliary electrode 28A-1 to the counter electrode 28C, the resistance of the counter electrode 28C may be reduced.

The pixel electrode 28A may include a plurality of pixel electrodes spaced apart from each other. Furthermore, the auxiliary electrode 28A-1 may include at least one auxiliary electrode, and may be arranged between the pixel electrodes 28A adjacent to each other. However, in the following description, for convenience of explanation, the auxiliary electrode 28A-1 may include a plurality of auxiliary electrodes, and the auxiliary electrodes 28A-1 may be arranged to be spaced apart from each other in the display area DA.

The intermediate layer 28B may include an organic emission layer 28B-2. In another optional example, the intermediate layer 28B may include the organic emission layer 28B-2, and additionally, the intermediate layer 28B may include at least one of the first auxiliary layer 28B-1 or the second auxiliary layer 28B-3. In this state, the first auxiliary layer 28B-1 may include at least one of a hole injection layer or a hole transport layer, and the second auxiliary layer 28B-3 may include at least one of an electron transport layer and an electron injection layer. In the above case, the first auxiliary layer 28B-1 may be arranged between the organic emission layer 28B-2 and the pixel electrode 28A, and the second auxiliary layer 28B-3 may be arranged between the organic emission layer 28B-2 and the counter electrode 28C. The inventive concepts are not limited thereto, and the intermediate layer 28B may include the organic emission layer 28B-2, and may further include various other functional layers (not shown). In the following description, for convenience of explanation, a case in which the intermediate layer 28B includes the first auxiliary layer 28B-1, the organic emission layer 28B-2, and the second auxiliary layer 28B-3 is described in detail.

At least one of the first auxiliary layer 28B-1, the organic emission layer 28B-2, and the second auxiliary layer 28B-3 of the intermediate layer 28B may include a plurality of layers arranged apart from each other. For example, a plurality of the organic emission layers 28B-2 may be arranged apart from each other in the entire surface of the display area DA. In this state, each of the plurality of the organic emission layers 28B-2 may be arranged to correspond to each pixel Px, each pixel Px may emit light of a different color according to the material of each of the plurality of the organic emission layers 28B-2. In another embodiment, a plurality of layers of at least one of the first auxiliary layer 28B-1 or the second auxiliary layer 28B-3, other than the organic emission layer 28B-2 may be arranged apart from each other to correspond to the organic emission layer 28B-2. In another embodiment, the plurality of the organic emission layers 28B-2 may be arranged apart from each other, and it may be possible to arrange at least one of the first auxiliary layer 28B-1 or the second auxiliary layer 28B-3 to cover the entire surface of the display area DA. In the following description, for convenience of explanation, a case in which the plurality of the organic emission layers 28B-2 are arranged apart from each other to form a pattern in the display area DA, and the first auxiliary layer 28B-1 and the second auxiliary layer 28B-3 are arranged on the entire surface of the display area DA, is mainly described in detail.

The counter electrode 28C may include a conductive material having a low work function. For example, the counter electrode 28C may include a (semi-)transparent layer including Ag, Mg, Al, Pt, Pd, Au, Ni, Nd, Ir, Cr, lithium (Li), calcium (Ca), an alloy thereof, or the like. Alternatively, the counter electrode 28C may further include a layer including a material such as ITO, IZO, ZnO or $In_2O_3$ on a (semi-)transparent layer including the above-described material. The counter electrode 28C may be integrally formed to correspond to the OLEDs included in the display area DA.

An upper layer 40 including an organic material may be formed on the counter electrode 28C. The upper layer 40 may be a layer to protect the counter electrode 28C and simultaneously increase light extraction efficiency. The upper layer 40 may include an organic material having a higher refractive index than the counter electrode 28C. Alternatively, the upper layer 40 may be provided by stacking layers having different refractive indexes. For example, the upper layer 40 may be provided by stacking a high refractive index layer/a low refractive index layer/a high refractive index layer. In this state, the refractive index of the high refractive index layer may be 1.7 or more, and the refractive index of the low refractive index layer may be 1.3 or less.

The upper layer 40 may additionally include LiF. Alternatively, the upper layer 40 may additionally include an inorganic insulating material such as silicon oxide ($SiO_2$) or silicon nitride ($SiN_x$). The upper layer 40 may be omitted as necessary. However, in the following description, for convenience of explanation, a case in which the upper layer 40 is arranged on the counter electrode 28C is described in detail.

The thin film encapsulation layer 30 for shielding the upper layer 40 may cover part of the display area DA and the peripheral area DPA to prevent infiltration of external moisture and oxygen. The thin film encapsulation layer 30 may include at least one organic encapsulation layer and at least one inorganic encapsulation layer. In the following description, for convenience of explanation, a case in which the thin film encapsulation layer 30 includes a first inorganic encapsulation layer 31, an organic encapsulation layer 32, and a second inorganic encapsulation layer 33, which are sequentially stacked on an upper surface of the upper layer 40 is mainly described in detail.

In the above case, the first inorganic encapsulation layer 31 may cover the counter electrode 28C, and include silicon oxide, silicon nitride, silicon oxynitride, and/or the like. Because the first inorganic encapsulation layer 31 is formed according to the structure thereunder, an upper surface of the first inorganic encapsulation layer 31 may not be flat. The organic encapsulation layer 32 covers the first inorganic encapsulation layer 31, and unlike the first inorganic encapsulation layer 31, an upper surface of the organic encapsulation layer 32 may be approximately flat. In detail, the upper surface of the organic encapsulation layer 32 may be approximately flat in a portion corresponding to the display area DA. The organic encapsulation layer 32 may include one or more materials selected from the group consisting of polyethylene terephthalate, polyethylene naphthalate, polycarbonate, polyimide, polyethylene sulfonate, polyoxymethylene, polyarylate, and hexamethyldisiloxane. The second inorganic encapsulation layer 33 may cover the organic encapsulation layer 32, and include silicon oxide, silicon nitride, silicon oxynitride, and/or the like.

The display device 20 may connect the auxiliary electrode 28A-1 and the counter electrode 28C to each other, thereby preventing generation of IR drop in the counter electrode 28C. Accordingly, the display device 20 may implement a clear image.

Figure 3:
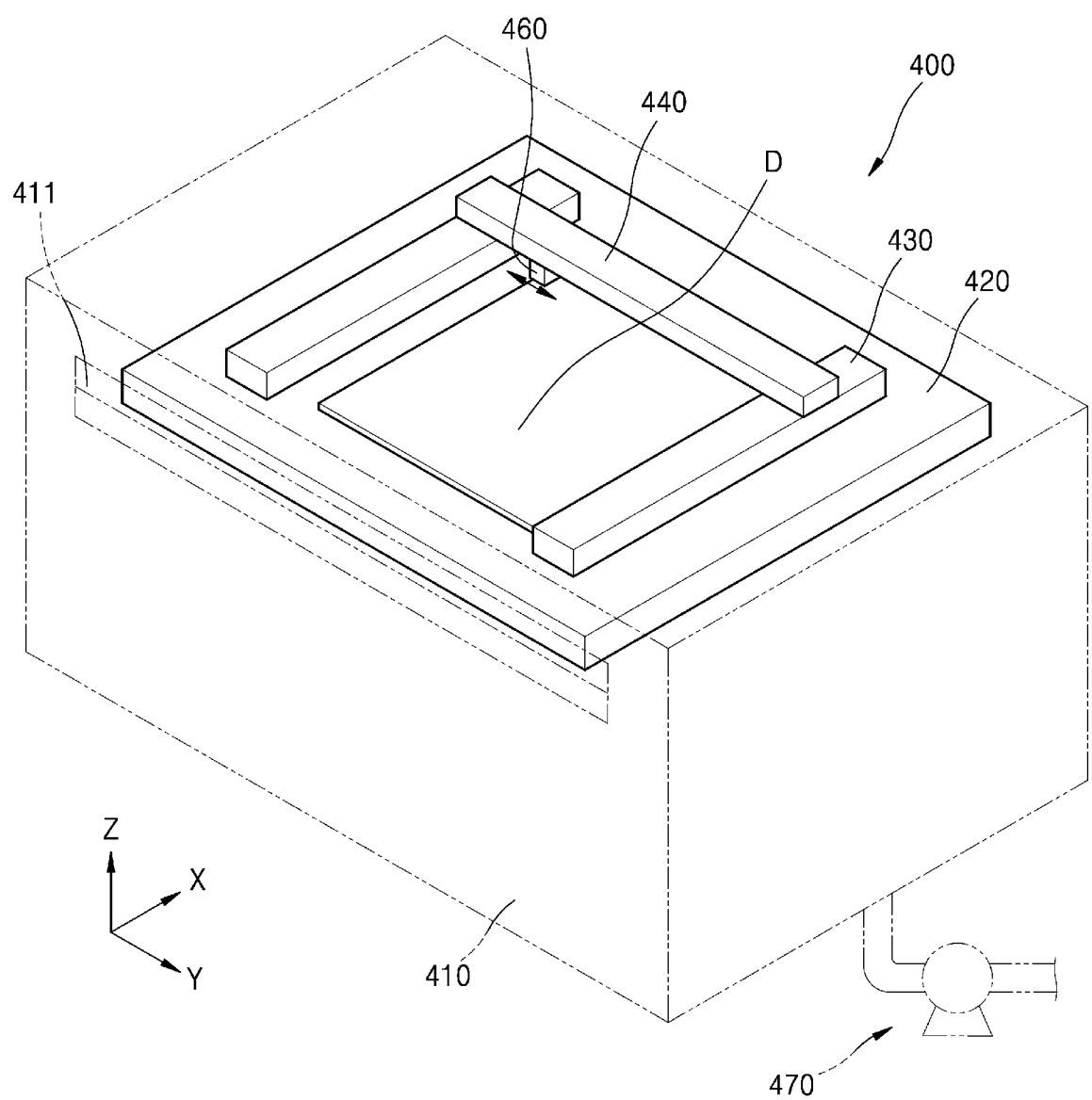
FIG. 3 is a perspective view of an apparatus for manufacturing a display device, according to an embodiment.

FIG. 3 is a perspective view of an apparatus 400 for manufacturing a display device, according to an embodiment.

Referring to FIG. 3, the apparatus 400 for manufacturing a display device may include a chamber 410, a stage 420, a guide portion 430, a first gantry 440, a nozzle portion 460, and a pressure regulator 470.

The chamber 410 may be connected to other processing portions through an opening/closing portion 411. The chamber 410 may have a space formed therein, and, although not illustrated, may be connected to a separate pressure regulator such as a pump and the like.

The stage 420 may be arranged in the chamber 410, and a display substrate D may be placed on the stage 420. In this state, the stage 420 may include a lift pin that ascends/descends as the display substrate D is placed thereon when the display substrate D is applied. Furthermore, the stage 420 may include an electrostatic chuck or adhesive chuck to firmly fix the display substrate D after being placed on the stage 420. The stage 420 may be in the form of a UVW stage for finely adjusting the position of the display substrate D after the display substrate D is arranged.

The guide portion 430 may be arranged on the stage 420 or in the chamber 410. In this state, the guide portion 430 may be arranged apart from each other with respect to the stage 420.

The first gantry 440 may be arranged on the guide portion 430 to be capable of performing a linear motion. In this state, the guide portion 430 and the first gantry 440 may be connected to each other in the form of a linear motor. For example, a driving portion, such as an electromagnet and the like, may be arranged on the guide portion 430, and a moving block coupled to the guide portion 430 is arranged on the first gantry 440, wherein a permanent magnet and the like may be arranged on the moving block.

The guide portion 430 may be arranged in various directions. For example, the guide portion 430 may be arranged in a first direction, for example, an X-axis direction of FIG. 3. In another embodiment, the guide portion 430 may be arranged in a second direction, for example, a Y-axis direction of FIG. 3. In the following description, for convenience of explanation, a case in which the guide portion 430 is arranged in the first direction is described in detail.

The first gantry 440 may be arranged on the guide portion 430 to perform a linear motion in a length direction of the guide portion 430, for example, the X-axis direction of FIG. 2.

The nozzle portion 460 may be arranged on the first gantry 440 to be capable of moving. For example, the nozzle portion 460 may perform a linear motion in the length direction of the first gantry 440, for example, the Y direction of FIG. 2. In the above case, the nozzle portion 460 may be movable in at least one of the first direction or the second direction. In this state, a separate driving portion for linearly moving the nozzle portion 460 may be arranged on the first gantry 440 or the nozzle portion 460. The driving portion may include a cylinder, a linear motor, and the like, and also the driving portion may include a ball screw and a motor to connect the nozzle portion 460.

The nozzle portion 460 may eject an organic solvent M (see FIG. 4D) or a metal ink MI (see FIG. 8B) onto the substrate 21. In this state, the metal ink MI may further include metal particles and a solvent. For example, the solvent may include triethylene glycol monoethyl ether (TGME), tetradecane, and/or the like. In this state, the metal ink MI is not limited to the above, and may include various solvents.

The nozzle portion 460 may include a plurality of nozzles. The nozzles may be arranged to be spaced apart from each other, and an interval between the respective nozzles may correspond to an interval between the auxiliary electrodes 28A-1 adjacent to each other.

The pressure regulator 470 may be connected to the chamber 410. In this state, the pressure regulator 470 may regulate the internal pressure of the chamber 410. The pressure regulator 470 may include a pipe connected to the chamber 410 and a pump arranged on the pipe.

Figure 5A:
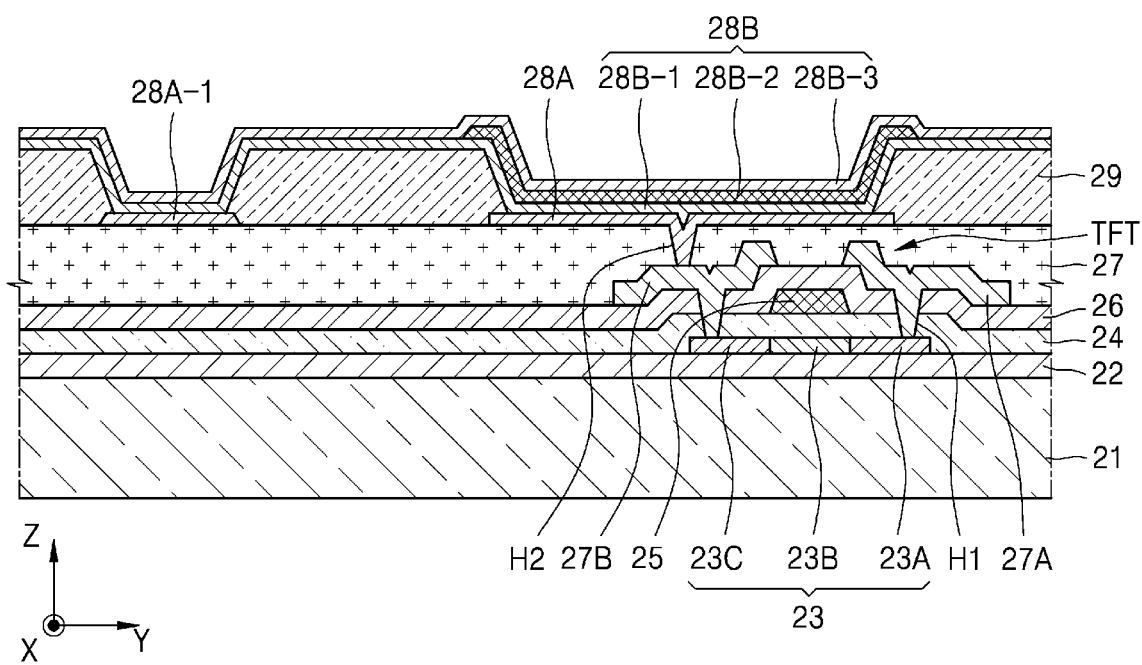
FIGS. 5A, 5B, 5C, 5D, and 5E are cross-sectional views showing a manufacturing sequence of the display device of FIG. 2.
Figure 5B:
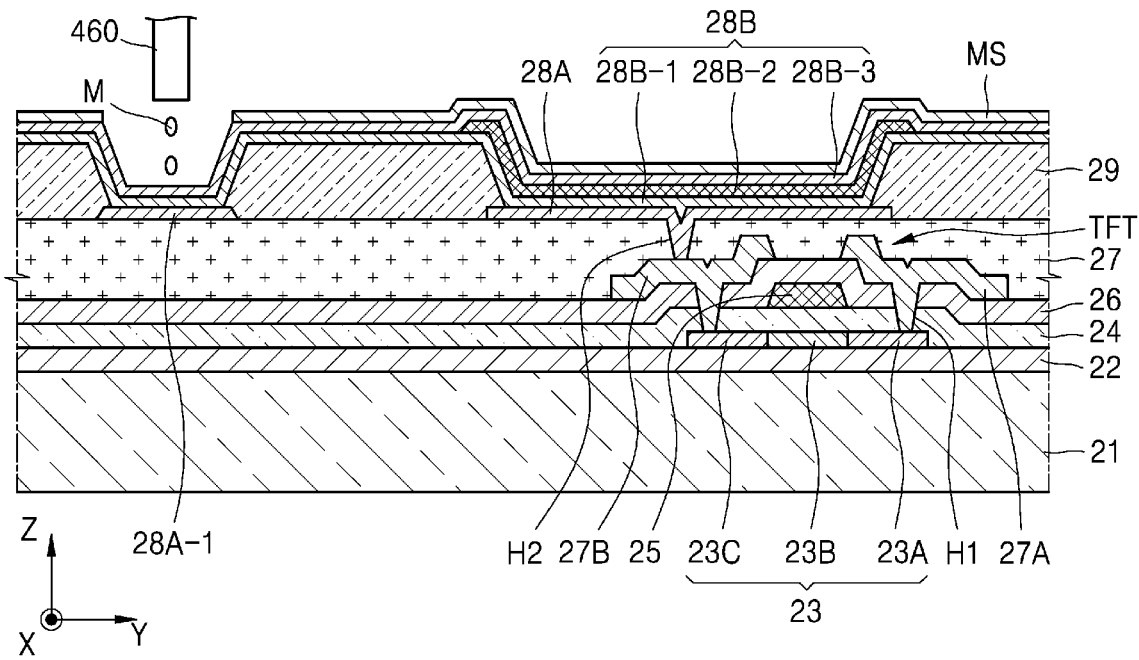
Figure 5C:
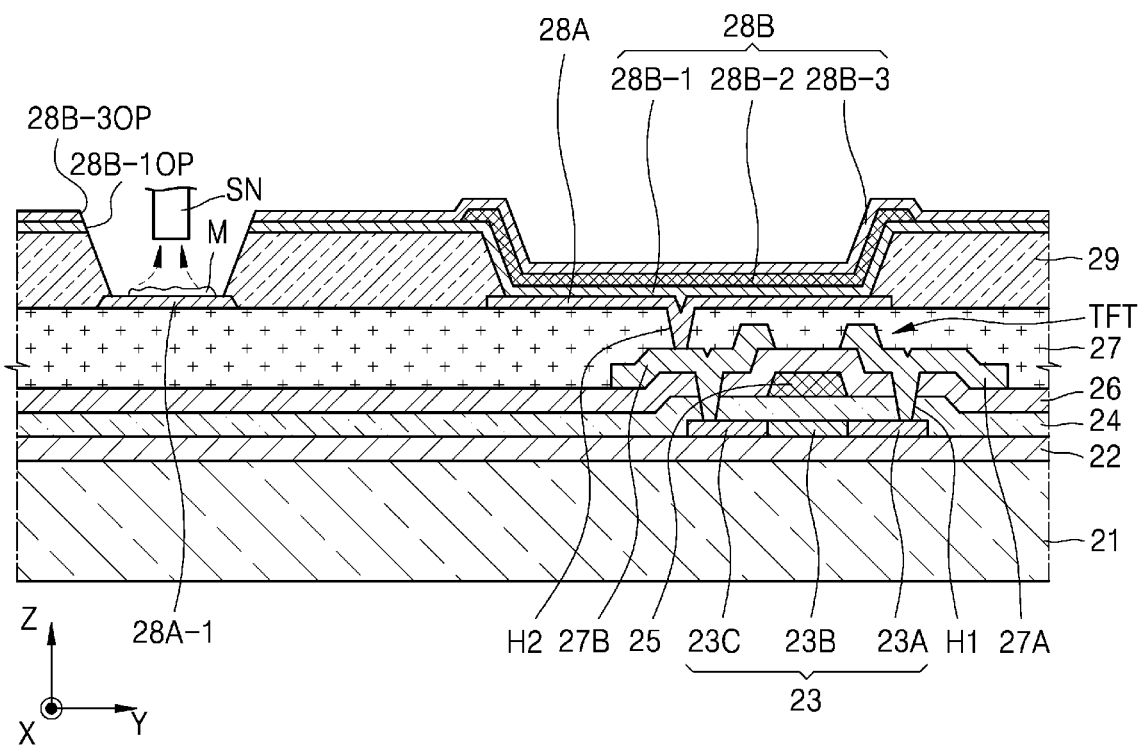

The apparatus 400 for manufacturing a display device may further include a suction portion SN (see FIG. 5C). In this state, the suction portion SN is formed in the form of a nozzle and may suck the organic solvent M ejected from the nozzle portion 460. In this case, the suction portion SN may be connected to a separate pump and the like, and to a separate pipe connecting the inside of the chamber 410 to the outside.

The suction portion SN may be connected to the first gantry 440. In another embodiment, the suction portion SN may be arranged on the chamber 410 to be capable of ascending/descending.

The apparatus 400 for manufacturing a display device may include two chambers that are divided into two spaces or connected to each other. In this case, the stage 420, the guide portion 430, the first gantry 440, and the nozzle portion 460 are arranged in one chamber so that the organic solvent M or the metal ink MI may be ejected onto the substrate 21. Furthermore, the pressure regulator 470 or the suction portion SN is arranged in another chamber so that some materials of the organic solvent M or the metal ink MI ejected onto the substrate 21 may be removed.

In the following description, for convenience of explanation, a case in which the stage 420, the guide portion 430, the first gantry 440, and the nozzle portion 460 are arranged in one chamber that is the chamber 410, with one of the pressure regulator 470 and the suction portion SN, is described in detail.

FIGS. 4A to 4G are cross-sectional views showing a manufacturing sequence of the display device 20 of FIG. 2.

Figure 4A:
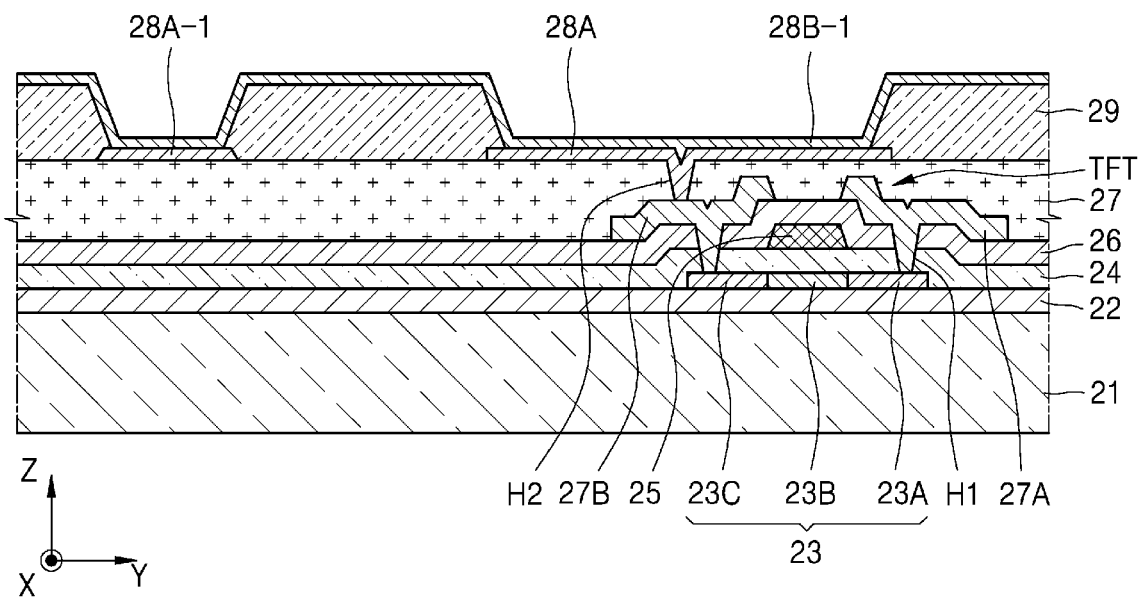
FIGS. 4A, 4B, 4C, 4D, 4E, 4F, and 4G are cross-sectional views showing a manufacturing sequence of the display device of FIG. 2.

Referring to FIG. 4A, after a thin film transistor (not shown), the pixel electrode 28A, and the auxiliary electrode 28A-1 are formed on the substrate 21, the pixel defining layer 29 may be formed, and then an opening area may be formed in the pixel defining layer 29. In this state, the opening area of the pixel defining layer 29 may expose the pixel electrode 28A to the outside, and may be arranged in the auxiliary electrode 28A-1 to expose part of the auxiliary electrode 28A-1 to the outside.

The first auxiliary layer 28B-1 may be formed on the pixel defining layer 29.

As described above, the first auxiliary layer 28B-1 may be formed on the entire surface of the display area DA. In this case, the first auxiliary layer 28B-1 may be formed on the pixel defining layer 29, the pixel electrode 28A that is exposed, and the auxiliary electrode 28A-1 that is exposed.

In another embodiment, the first auxiliary layer 28B-1 may be formed only in the opening area of the pixel defining layer 29. When the first auxiliary layer 28B-1 is formed only in the opening area of the pixel defining layer 29, the first auxiliary layer 28B-1 may be arranged apart from each other.

In the following description, for convenience of explanation, a case in which the first auxiliary layer 28B-1 is formed on the entire surface of the display area DA is described in detail.

Figure 4B:
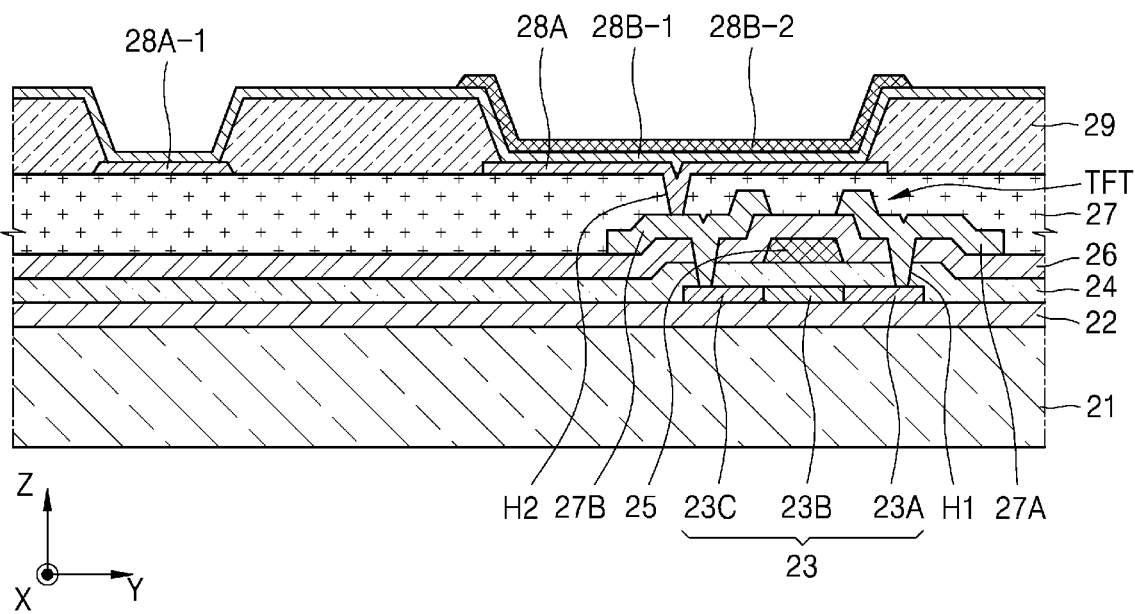

Referring to FIG. 4B, the organic emission layer 28B-2 may be formed on the first auxiliary layer 28B-1. The organic emission layer 28B-2 may be formed only in the opening area of the pixel defining layer 29. In this state, the organic emission layer 28B-2 may be arranged apart from each other and may form a certain pattern in the display area DA. Furthermore, the organic emission layer 28B-2 may be arranged such that materials that are different from each other according to the color of emitted light correspond to each opening area of the pixel defining layer 29.

In another embodiment, the organic emission layer 28B-2 may be arranged to cover the entire surface of the display area DA. In this state, the organic emission layer 28B-2 may be in the form of stacking materials for emitting light of different colors in a height direction, for example, a Z-axis direction of FIG. 4B. In this case, a plurality of pixels may emit light of the same color, and the color of light emitted from each pixel may be white. Furthermore, the organic emission layer 28B-2 may be arranged not only on the pixel electrode 28A that is exposed, but on the auxiliary electrode 28A-1 that is exposed.

In the following description, for convenience of explanation, a case in which the organic emission layer 28B-2 is arranged only in the opening area of the pixel defining layer 29 and arranged apart from each other on the display area DA is described in detail.

Figure 4C:
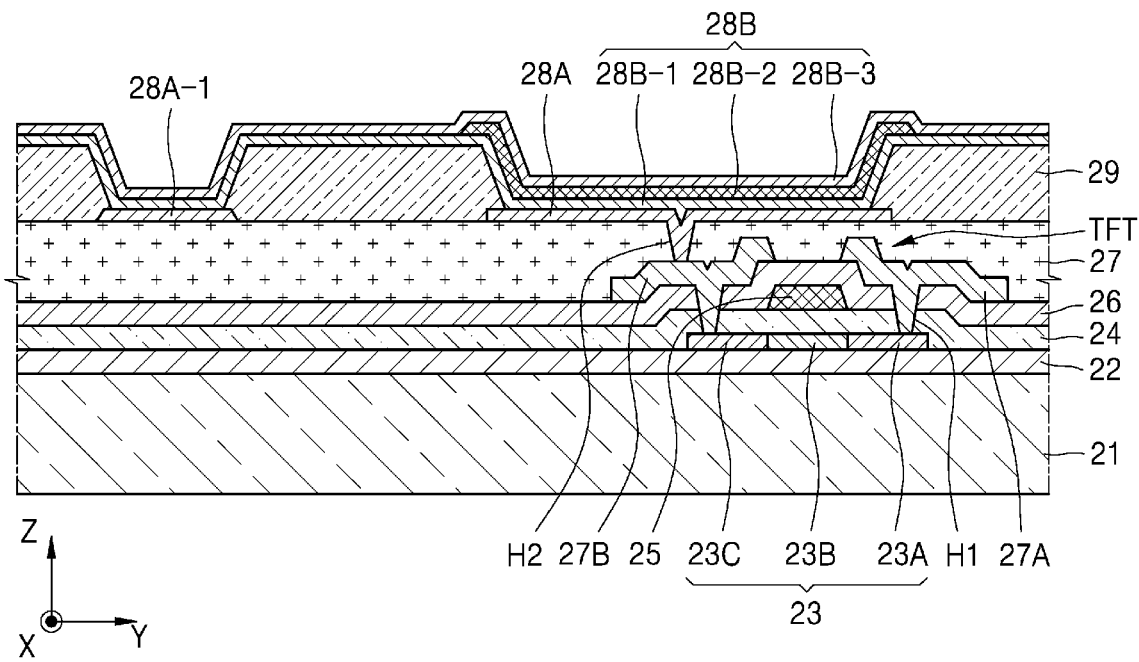

Referring to FIG. 4C, the second auxiliary layer 28B-3 may be formed on the organic emission layer 28B-2 and the first auxiliary layer 28B-1. In this state, the second auxiliary layer 28B-3 may be arranged to cover the entire surface of the display area DA. In this case, the second auxiliary layer 28B-3 may be arranged to cover not only the pixel defining layer 29, but also the pixel electrode 28A that is exposed and the auxiliary electrode 28A-1 that is exposed.

Figure 4D:
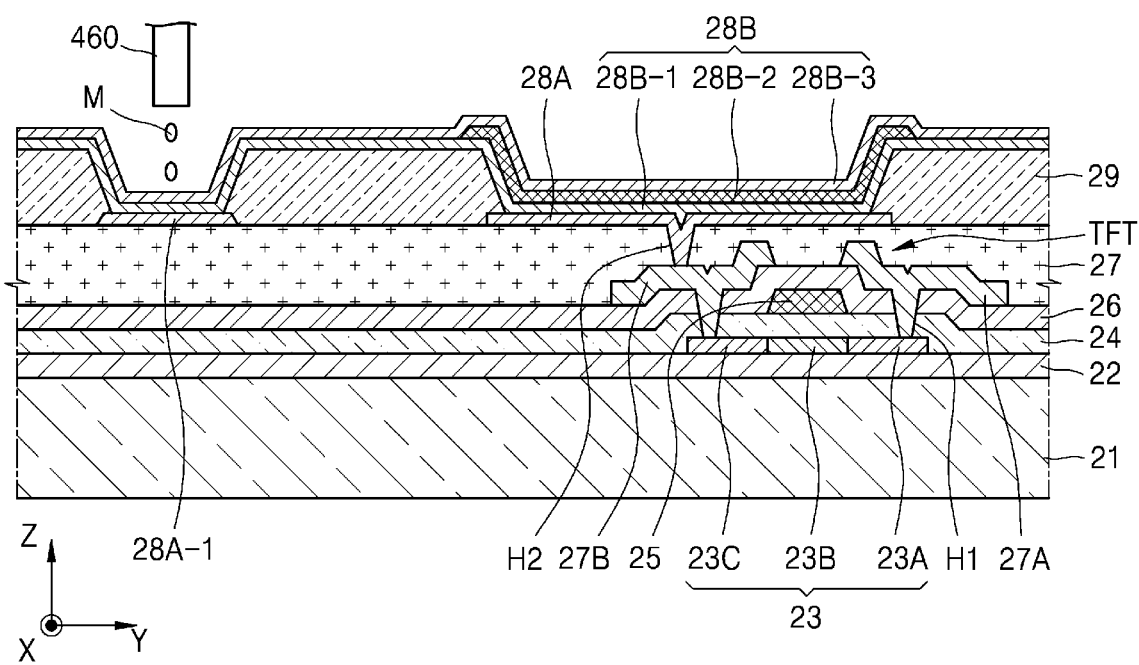

Referring to FIG. 4D, as described above, the substrate 21 on which up to the second auxiliary layer 28B-3 is formed is arranged in the apparatus 400 for manufacturing a display device illustrated in FIG. 3, and then the organic solvent M may be supplied to the auxiliary electrode 28A-1 through the nozzle portion 460. In this state, the nozzle portion 460 may be arranged to correspond to the position where the auxiliary electrode 28A-1 is arranged, to eject the organic solvent M, or may perform a linear motion on the first gantry 440 according to the position of the auxiliary electrode 28A-1. Alternatively, the first gantry 440 may perform a linear motion.

The organic solvent M may dissolve and remove the first auxiliary layer 28B-1 and the second auxiliary layer 28B-3. In this state, the organic solvent M may be a solvent, such as hydrogen peroxide ($H_2O_2$), sulfuric acid ($H_2SO_4$), and/or the like, to be capable of removing at least one of the first auxiliary layer 28B-1 or the second auxiliary layer 28B-3.

Generally, as described above, a laser may be used to remove at least one of the first auxiliary layer 28B-1 or the second auxiliary layer 28B-3 arranged on the auxiliary electrode 28A-1. However, when a laser is used, as the volume of laser equipment increases, the total size of the apparatus 400 for manufacturing a display device is increased so that a large space may be taken to install the apparatus 400 for manufacturing a display device. In addition, the use of a laser may consume a large amount of energy.

However, as described above, the above problem may be solved by removing at least one of the first auxiliary layer 28B-1 or the second auxiliary layer 28B-3 using the organic solvent M through the nozzle portion 460.

Furthermore, as described above, when a laser is used, heat may be generated to remove at least one of the first auxiliary layer 28B-1 or the second auxiliary layer 28B-3 on the auxiliary electrode 28A-1. As the organic emission layer 28B-2 on the pixel electrode 28A is thermally damaged due to the heat, the display device 20 that is manufactured may malfunction and further the life of the display device 20 may be reduced.

However, as described above, by using the nozzle portion 460, it may be possible to remove at least one of the first auxiliary layer 28B-1 or the second auxiliary layer 28B-3 on the auxiliary electrode 28A-1, without damaging the organic emission layer 28B-2 on the pixel electrode 28A.

Figure 4E:
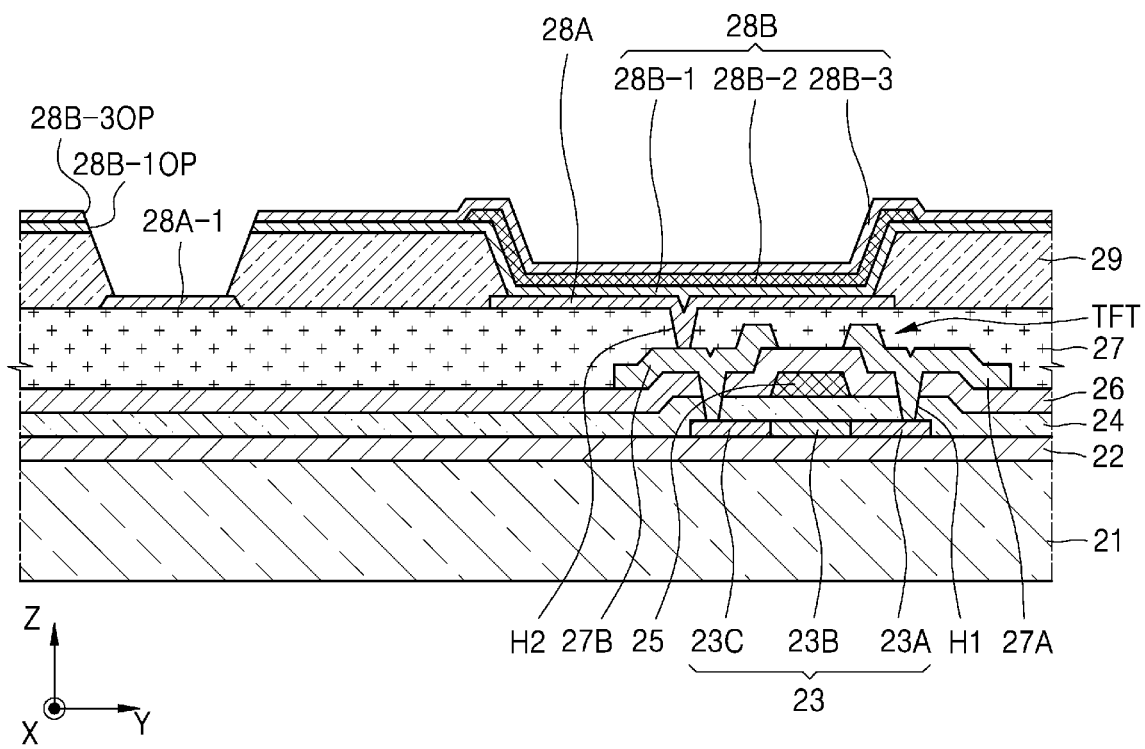

Referring to FIG. 4E, when parts of the first auxiliary layer 28B-1 and the second auxiliary layer 28B-3 on the auxiliary electrode 28A-1 are removed by the organic solvent M, the first auxiliary layer 28B-1 and the second auxiliary layer 28B-3 may include a first auxiliary layer opening area 28B-10P and a second auxiliary layer opening area 28B-30P, respectively. In this state, the auxiliary electrode 28A-1 may be exposed to the outside through the first auxiliary layer opening area 28B-10P and the second auxiliary layer opening area 28B-30P.

In the above case, the pressure regulator 470 may maintain the internal pressure of the chamber 410 in a low pressure state. For example, because the pressure regulator 470 maintains the internal pressure of the chamber 410 to be lower than the atmospheric pressure, the organic solvent M remaining on the auxiliary electrode 28A-1 may be removed by sublimation.

Figure 4F:
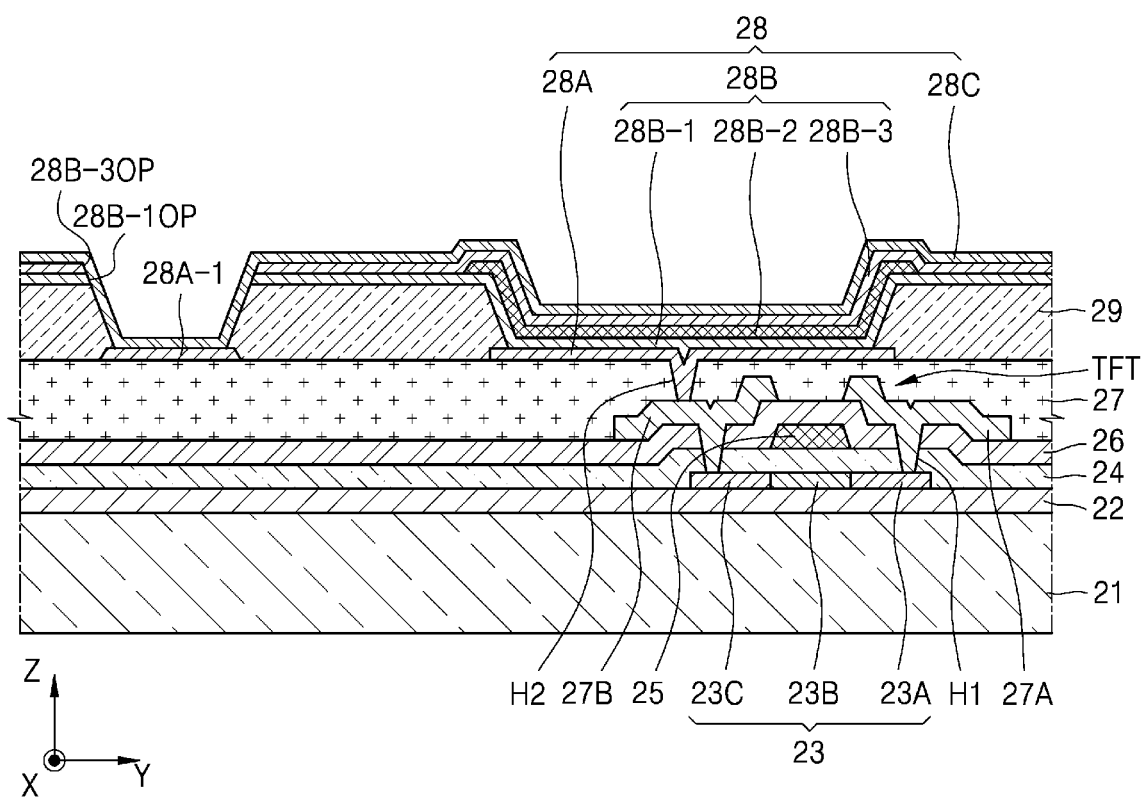

Referring to FIG. 4F, the substrate 21 is drawn out from the apparatus 400 for manufacturing a display device of FIG. 3 and then inserted into another chamber and the like. Then, the counter electrode 28C may be formed on the entire surface of the display area DA. In this state, the counter electrode 28C may be in direct contact with the auxiliary electrode 28A-1 that is exposed through the first auxiliary layer opening area 28B-10P and the second auxiliary layer opening area 28B-30P, to be connected to the auxiliary electrode 28A-1.

Figure 4G:
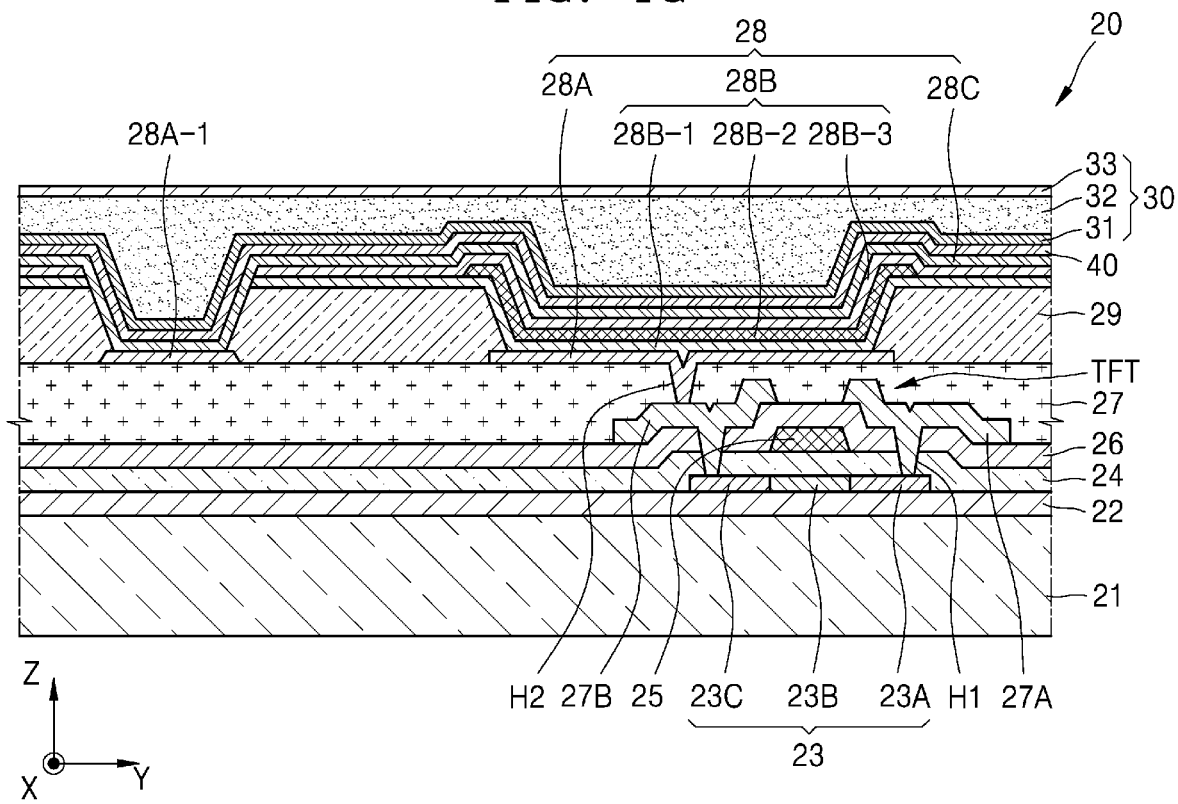

Referring to FIG. 4G, after the process is completed, the upper layer 40 and the thin film encapsulation layer 30 may be sequentially formed on the counter electrode 28C. For example, after the upper layer 40 is formed on the counter electrode 28C, the first inorganic encapsulation layer 31, the organic encapsulation layer 32, and the second inorganic encapsulation layer 33 may be formed.

Accordingly, according to a method of manufacturing a display device according to an embodiment, at least one of the first auxiliary layer 28B-1 or the second auxiliary layer 28B-3 arranged on the auxiliary electrode 28A-1 may be removed through a simple structure. Furthermore, according to a method of manufacturing a display device according to an embodiment, when at least one of the first auxiliary layer 28B-1 or the second auxiliary layer 28B-3 on the auxiliary electrode 28A-1 is removed, damage to the organic emission layer 28B-2 on the pixel electrode 28A may be prevented.

FIGS. 5A to 5E are cross-sectional views showing a manufacturing sequence of the display device 20 of FIG. 2.

Referring to FIG. 5A, after the layers are formed on the substrate 21, the auxiliary electrode 28A-1 and the pixel electrode 28A may be formed on the passivation film 27. Then, after the pixel defining layer 29 is formed, an opening portion may be formed in the pixel defining layer 29 such that at least part of the auxiliary electrode 28A-1 and at least part of the pixel electrode 28A are exposed to the outside.

When the above process is completed, the first auxiliary layer 28B-1 may be formed on the auxiliary electrode 28A-1, the pixel defining layer 29, and the pixel electrode 28A, and the organic emission layer 28B-2 may be formed on the first auxiliary layer 28B-1 on which the pixel electrode 28A is arranged. Furthermore, the second auxiliary layer 28B-3 may be formed on the organic emission layer 28B-2. In this case, it is likely that the first auxiliary layer 28B-1 and the second auxiliary layer 28B-3 are sequentially stacked on the auxiliary electrode 28A-1.

Referring to FIG. 5B, a separate mask MS that is a blocking member may be arranged on the second auxiliary layer 28B-3. In this state, the mask MS may include photoresist. In another embodiment, the mask MS may include a film including a material that is not dissolved or removed by the organic solvent M. In the following description, for convenience of explanation, a case in which the mask MS includes photoresist is mainly described in detail.

The above-described mask MS may be opened in a portion where the auxiliary electrode 28A-1 is arranged. In this case, when the mask MS is arranged on the second auxiliary layer 28B-3, the second auxiliary layer 28B-3 above the auxiliary electrode 28A-1 may be exposed through the open portion of the mask MS.

The nozzle portion 460 may be arranged above the first auxiliary layer 28B-1 and the second auxiliary layer 28B-3 arranged on the auxiliary electrode 28A-1, and the organic solvent M may be supplied onto the first auxiliary layer 28B-1 and the second auxiliary layer 28B-3 through the open portion of the mask MS. The organic solvent M may dissolve the first auxiliary layer 28B-1 and the second auxiliary layer 28B-3 arranged on the auxiliary electrode 28A-1. In this state, the nozzle portion 460 may be arranged to correspond to each auxiliary electrode 28A-1. Furthermore, after supplying the organic solvent M to some of a plurality of auxiliary electrodes 28A-1, the nozzle portion 460 may linearly move to supply the organic solvent M to some other auxiliary electrodes 28A-1. In this case, a movement direction, a movement distance, and the like of the nozzle portion 460 may be determined according to the preset position of the auxiliary electrode 28A-1.

As described above, after the first auxiliary layer 28B-1 and the second auxiliary layer 28B-3 on the auxiliary electrode 28A-1 are removed by supplying the organic solvent M thereto, the mask MS may be removed from the second auxiliary layer 28B-3.

Referring to FIG. 5C, when the first auxiliary layer 28B-1 and the second auxiliary layer 28B-3 are removed by the organic solvent M from the auxiliary electrode 28A-1, the auxiliary electrode 28A-1 may be exposed to the outside. In this state, the organic solvent M arranged on at least one of the auxiliary electrode 28A-1, the first auxiliary layer 28B-1, or the second auxiliary layer 28B-3 may be removed through the suction portion SN. In this case, the suction portion SN may be arranged on a separate gantry, a guide portion, and the like in the same or similar manner as the nozzle portion 460 of FIG. 3 and may perform a linear motion. In another embodiment, although not illustrated in FIG. 3, the suction portion SN may be integrally formed with the nozzle portion 460 to perform a linear motion with the nozzle portion 460.

In the above case, when the suction portion SN is operated, the pressure regulator 470 of FIG. 3 may also be operated. However, in the following description, for convenience of explanation, a case in which only the suction portion SN is operated to remove the organic solvent M is described in detail.

Figure 5D:
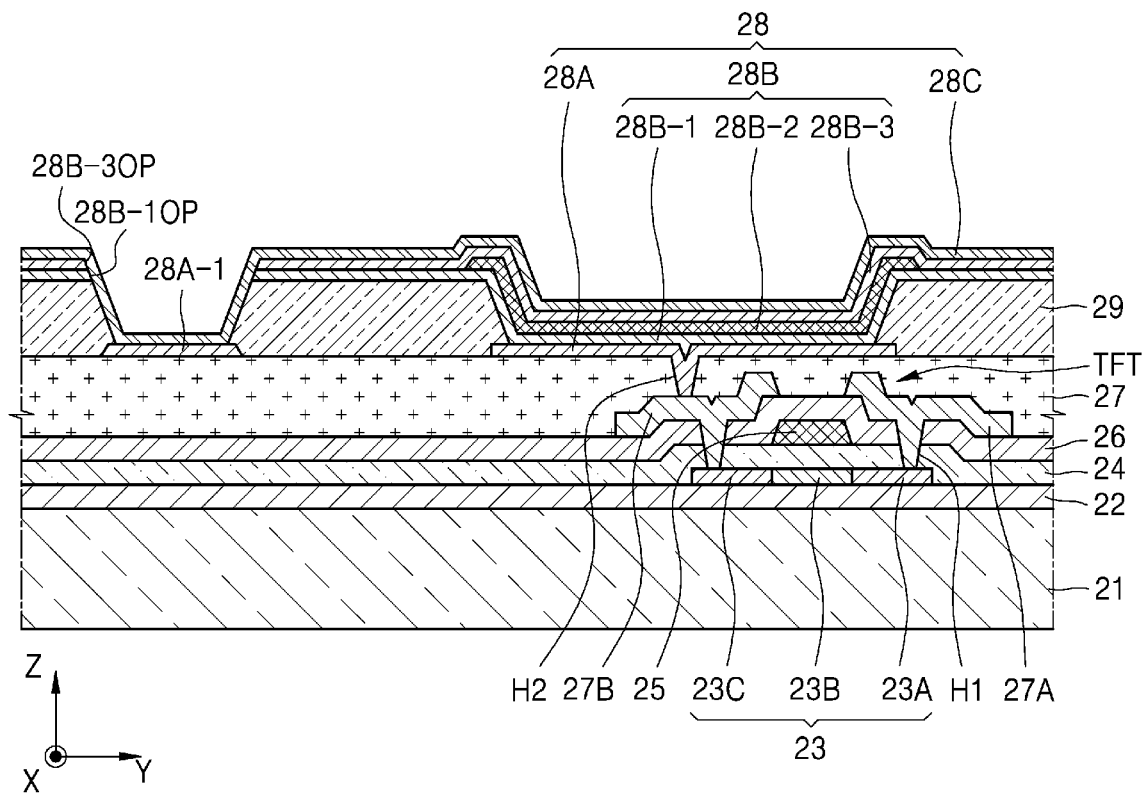

Referring to FIG. 5D, after the removal of the organic solvent M is completed, the counter electrode 28C may be formed on the second auxiliary layer 28B-3. In this state, the counter electrode 28C may be formed on the entire surface of the substrate 21. The auxiliary electrode 28A-1 may be exposed to the outside as the first auxiliary layer 28B-1 and the second auxiliary layer 28B-3 are completely removed by the organic solvent M, and during the formation of the counter electrode 28C, the counter electrode 28C may be arranged on the auxiliary electrode 28A-1 to be in direct contact with the auxiliary electrode 28A-1.

Figure 5E:
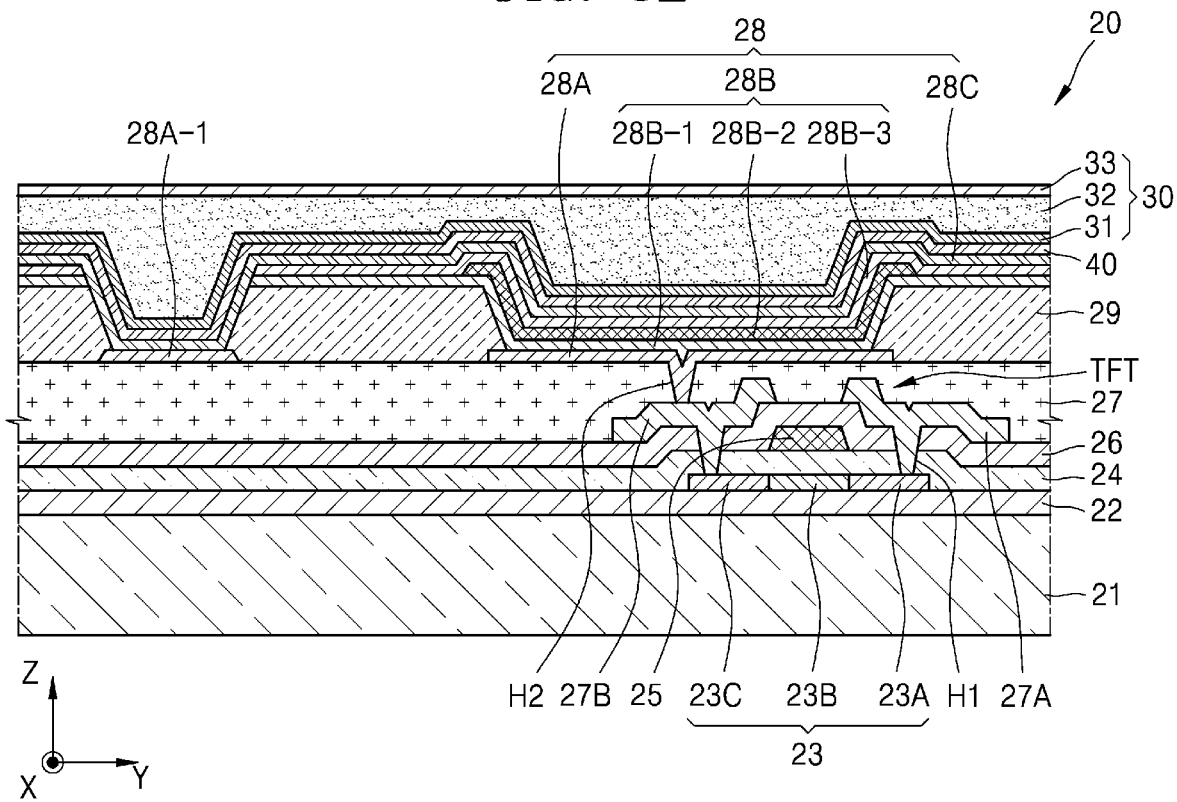

Referring to FIG. 5E, after the counter electrode 28C is formed, the upper layer 40, the first inorganic encapsulation layer 31, the organic encapsulation layer 32, and the second inorganic encapsulation layer 33 may be sequentially formed on the counter electrode 28C. Furthermore, although not illustrated, a touch layer may be further formed on the second inorganic encapsulation layer 33.

Accordingly, according to a method of manufacturing a display device according to an embodiment, the first auxiliary layer 28B-1 and the second auxiliary layer 28B-3 may be quickly and accurately removed from the auxiliary electrode 28A-1.

FIGS. 6A to 6F are cross-sectional views showing a manufacturing sequence of the display device 20 of FIG. 2.

Figure 6A:
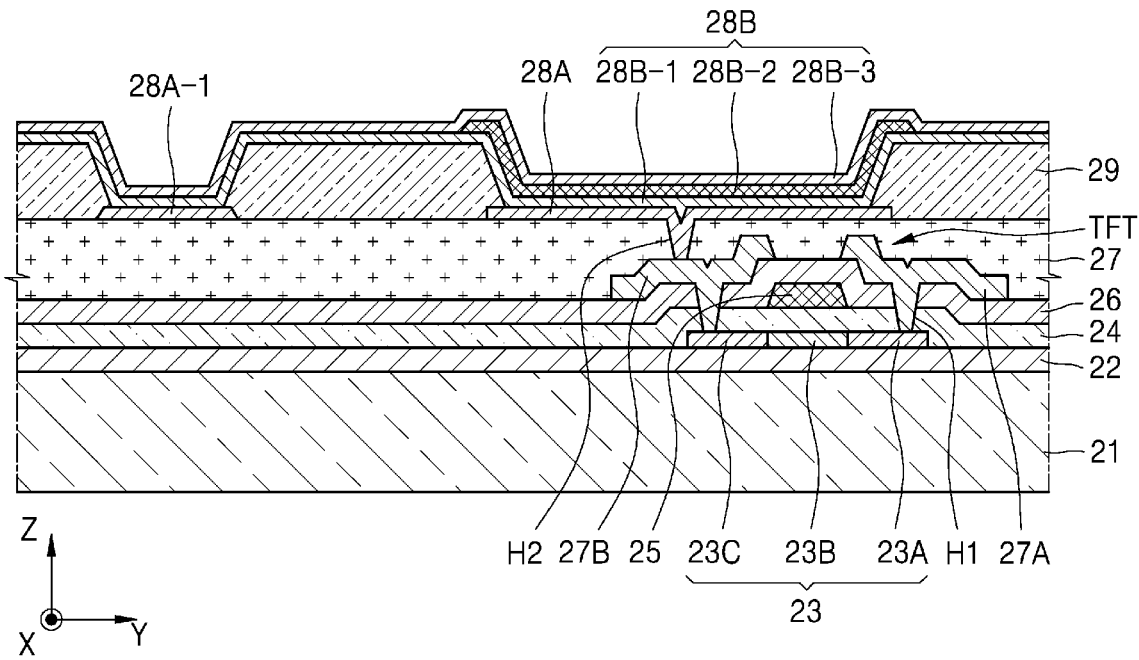
FIGS. 6A, 6B, 6C, 6D, 6E, and 6F are cross-sectional views showing a manufacturing sequence of the display device of FIG. 2.

Referring to FIG. 6A, the buffer layer 22, the active layer 23, the gate insulating layer 24, the gate electrode 25, the interlayer insulating layer 26, the source electrode 27A, the drain electrode 27B, the passivation film 27, the pixel electrode 28A, the auxiliary electrode 28A-1, the pixel defining layer 29, the first auxiliary layer 28B-1, the organic emission layer 28B-2, and the second auxiliary layer 28B-3 may be formed on the substrate 21.

Figure 6B:
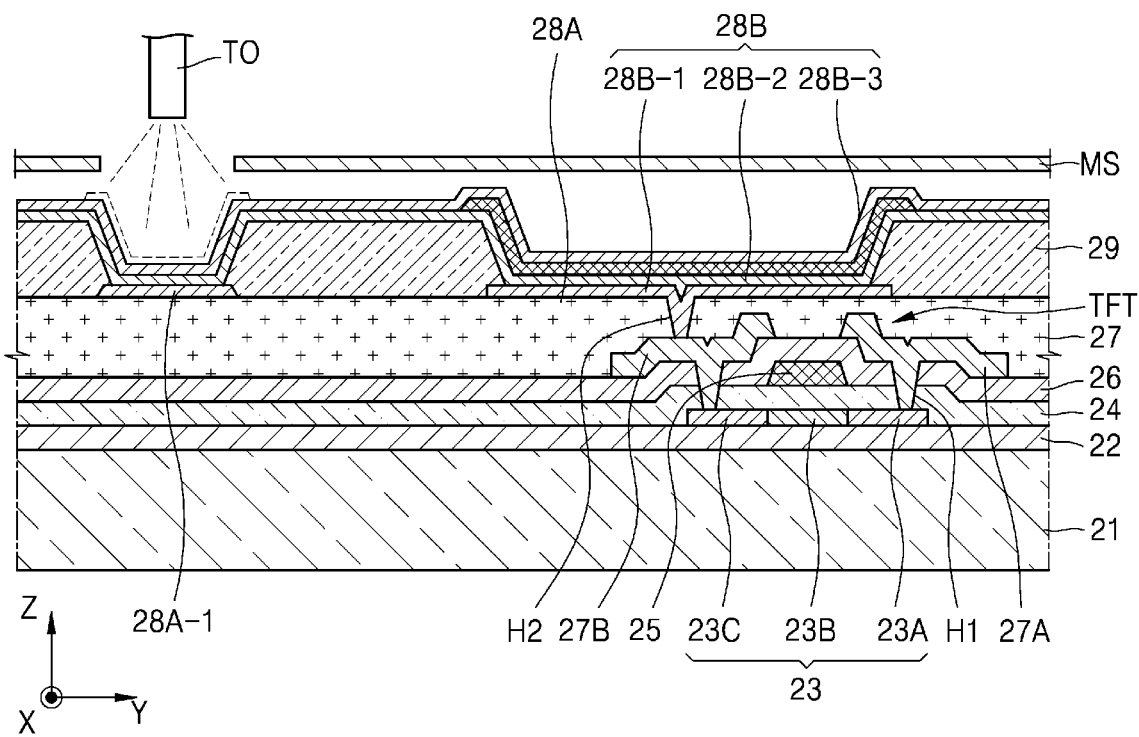

Referring to FIG. 6B, the mask MS may be arranged to be spaced apart from the second auxiliary layer 28B-3. In this state, the mask MS may include a metal material, and an opening portion may be formed to correspond to the position of the auxiliary electrode 28A-1. In this case, the mask MS may be in a state of completely adhering to the second auxiliary layer 28B-3 or being spaced apart from the second auxiliary layer 28B-3. In the following description, for convenience of explanation, a case in which the mask MS is apart from the second auxiliary layer 28B-3 is mainly described in detail.

The position of the above-described mask MS may be adjusted according to the position of the substrate 21. In this case, the opening portion of the mask MS may be arranged in the upper surface of the auxiliary electrode 28A-1. A tool member TO may perform a hydrophilic treatment on the upper surface of the second auxiliary layer 28B-3 arranged on the auxiliary electrode 28A-1 through the opening portion of the mask MS. In this state, the tool member TO may eject a separate hydrophilic material onto the second auxiliary layer 28B-3 or a plasma gas onto the upper surface of the second auxiliary layer 28B-3.

Figure 6C:
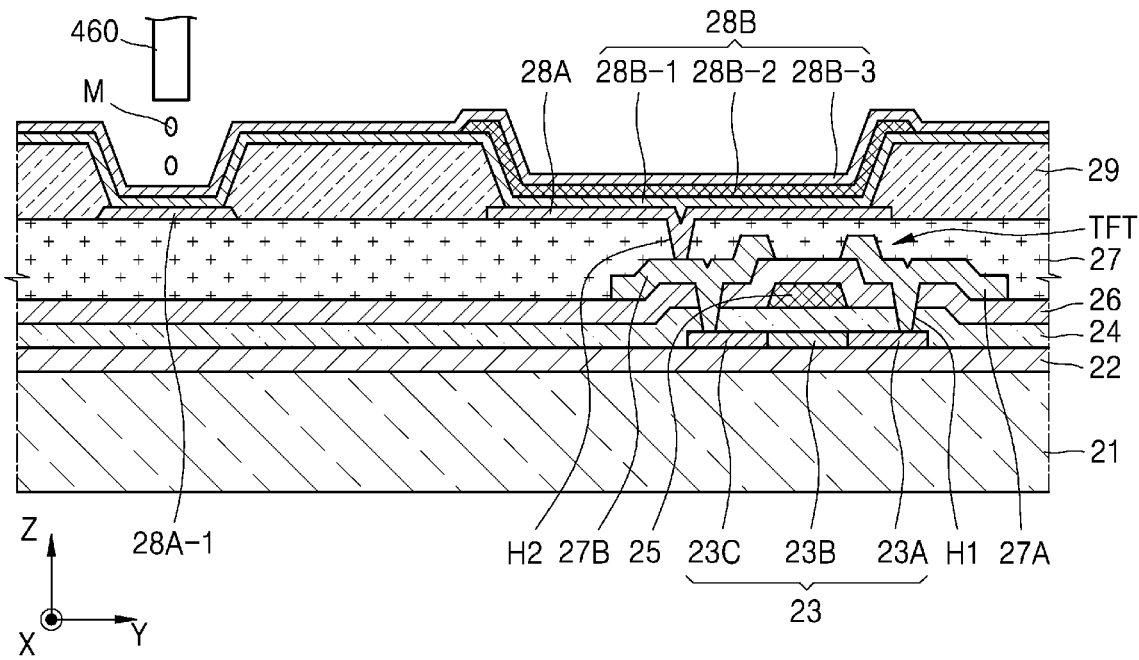

Referring to FIG. 6C, the organic solvent M may be provided through the nozzle portion 460 to the second auxiliary layer 28B-3 that is surface-processed. In this state, the mask MS may be in a state of being removed or not. When the mask MS is removed, the nozzle portion 460 may be arranged on the auxiliary electrode 28A-1 to correspond to a portion of the second auxiliary layer 28B-3 that is hydrophilic-treated, and may provide the organic solvent M to the second auxiliary layer 28B-3. Conversely, when the mask MS is not removed, the nozzle portion 460 may provide the organic solvent M to the opening portion of the mask MS. In the following description, for convenience of explanation, a case in which the nozzle portion 460 provides the organic solvent M when the mask MS is removed is described in detail.

In the above case, it is possible to eject the organic solvent M to the opening portion of the mask MS without performing a hydrophilic treatment on the second auxiliary layer 28B-3. However, in the following description, for convenience of explanation, a case in which, after a hydrophilic treatment is performed on the second auxiliary layer 28B-3 using the mask MS, the organic solvent M is provided to the upper surface of the second auxiliary layer 28B-3 is described in detail.

Figure 6D:
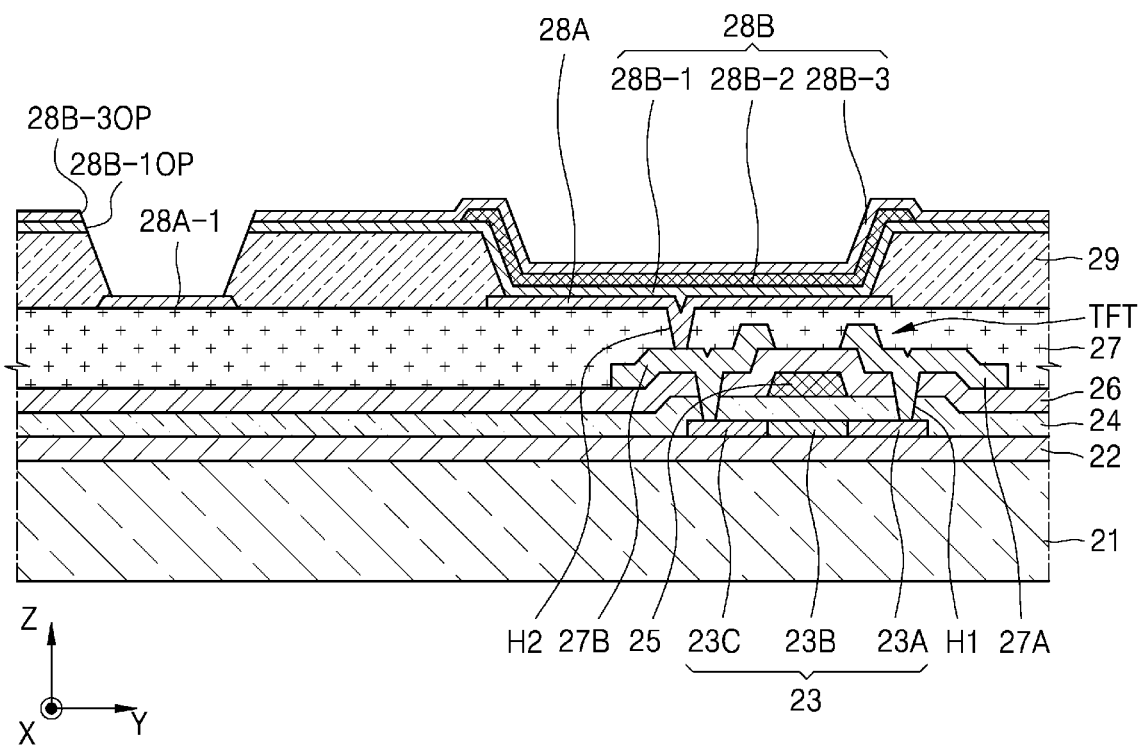

Referring to FIG. 6D, as described above, when the organic solvent M is provided to the hydrophilic-treated upper surface of the second auxiliary layer 28B-3, the organic solvent M may be placed on the upper surface of the second auxiliary layer 28B-3 that is hydrophilic-treated to dissolve a portion of the second auxiliary layer 28B-3 that is hydrophilic-treated. Furthermore, the first auxiliary layer 28B-1 may be dissolved by the organic solvent M after the second auxiliary layer 28B-3 is removed.

As described above, the first auxiliary layer 28B-1 and the second auxiliary layer 28B-3 that are dissolved by the organic solvent M may be removed by being vaporized with the organic solvent M by maintaining the internal pressure of the chamber 410 at a low pressure that is a certain pressure or less, through The pressure regulator 470 of FIG. 3. In another embodiment, as illustrated in FIG. 5C, the first auxiliary layer 28B-1 and the second auxiliary layer 28B-3 that are dissolved may be removed by sucking the organic solvent M using the suction portion SN.

As described above, when the first auxiliary layer 28B-1 and the second auxiliary layer 28B-3 on the auxiliary electrode 28A-1 are removed, the auxiliary electrode 28A-1 may be exposed to the outside.

Figure 6E:
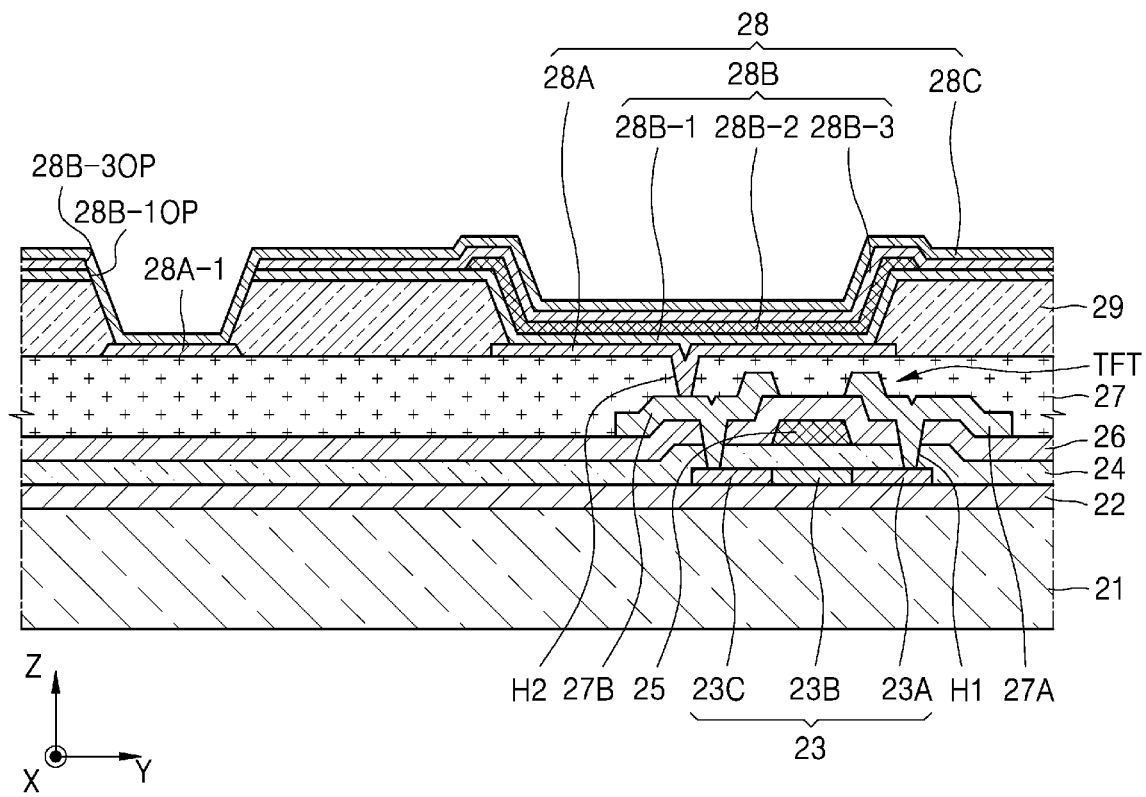

Referring to FIG. 6E, after the above process is completed, the counter electrode 28C may be formed on the second auxiliary layer 28B-3. In this state, the counter electrode 28C may be integrally arranged on the entire surface of the display area DA. In this case, the counter electrode 28C may be connected to the auxiliary electrode 28A-1 through the opening portions formed in the first auxiliary layer 28B-1 and the second auxiliary layer 28B-3.

Figure 6F:
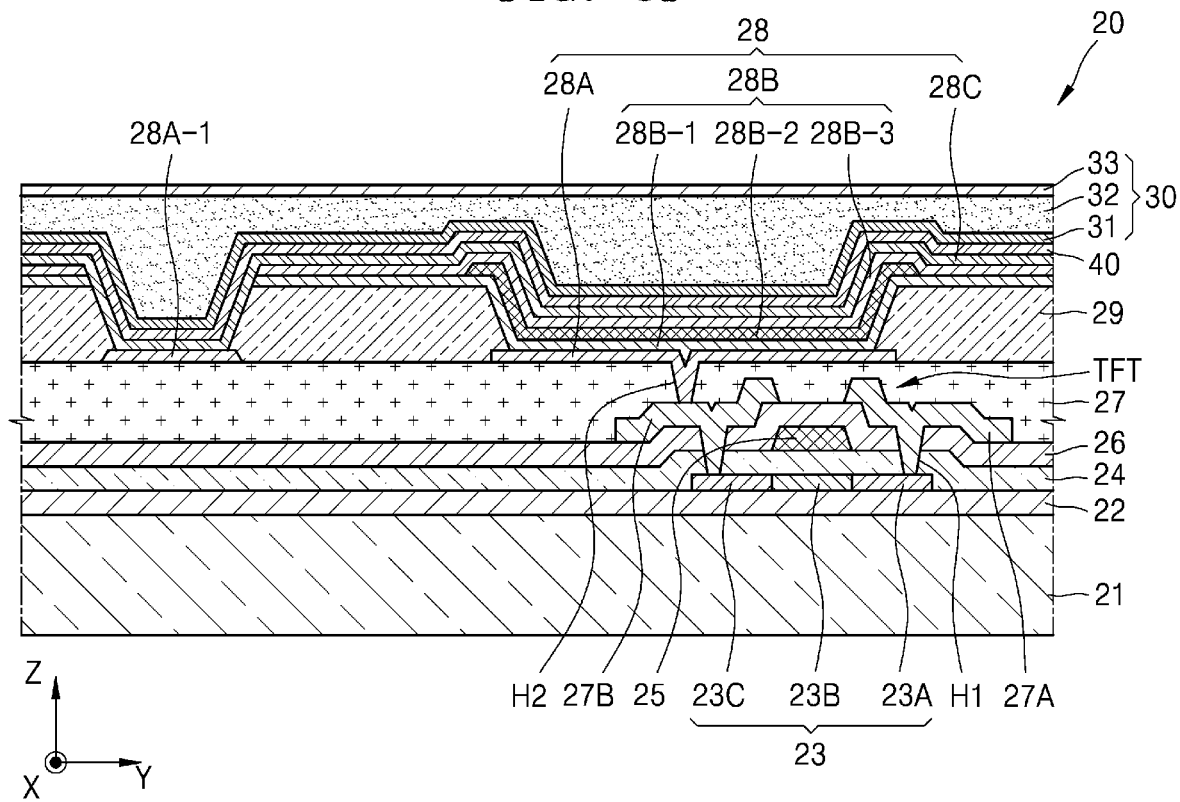

Referring to FIG. 6F, after the counter electrode 28C is formed, the upper layer 40, the first inorganic encapsulation layer 31, the organic encapsulation layer 32, and the second inorganic encapsulation layer 33 may be formed on the counter electrode 28C.

Accordingly, according to a method of manufacturing a display device according to an embodiment, the first auxiliary layer 28B-1 and the second auxiliary layer 28B-3 may be quickly and accurately removed from the auxiliary electrode 28A-1.

Figure 7:
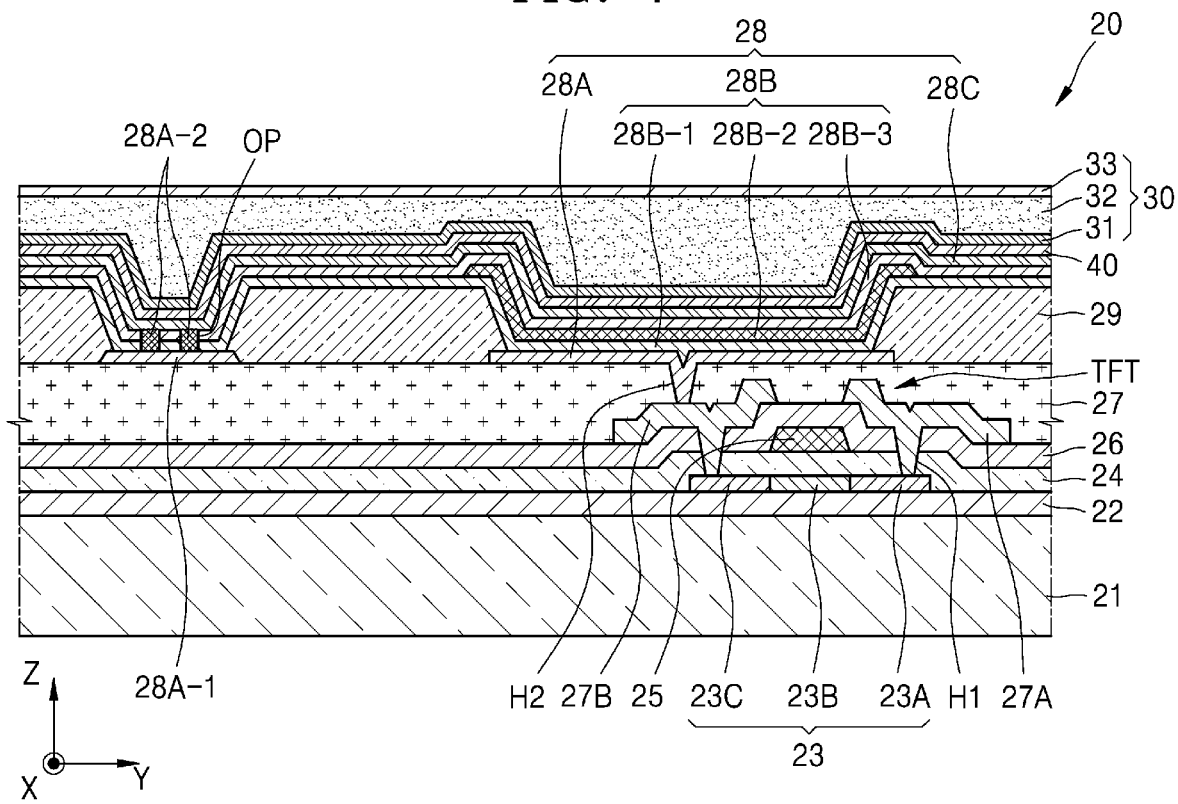
FIG. 7 is a cross-sectional view of a display device according to another embodiment.

FIG. 7 is a cross-sectional view of a display device according to another embodiment.

Referring to FIG. 7, the display device 20 may include a thin film transistor (not shown), the OLED 28, and the thin film encapsulation layer 30, which are arranged on the substrate 21. In this state, the buffer layer 22, the active layer 23, the gate insulating layer 24, the gate electrode 25, the interlayer insulating layer 26, the source electrode 27A, the drain electrode 27B, the passivation film 27, the pixel electrode 28A, the auxiliary electrode 28A-1, the pixel defining layer 29, the first auxiliary layer 28B-1, the organic emission layer 28B-2, the second auxiliary layer 28B-3, the upper layer 40, the first inorganic encapsulation layer 31, the organic encapsulation layer 32, and the second inorganic encapsulation layer 33 may be arranged on the substrate 21.

The display device 20 may include a bridge portion 28A-2 that connects the auxiliary electrode 28A-1 to the counter electrode 28C. In this state, the bridge portion 28A-2 may include a metal material, and may be arranged to penetrate the first auxiliary layer 28B-1 and the second auxiliary layer 28B-3 that are arranged on the auxiliary electrode 28A-1. Furthermore, the bridge portion 28A-2 may extend from the counter electrode 28C to the auxiliary electrode 28A-1 to be connected to each of the counter electrode 28C and the auxiliary electrode 28A-1.

Accordingly, the display device 20 may prevent a voltage drop of the counter electrode 28C. In the following description, a method of manufacturing the display device 20 is described in detail.

Figure 8A:
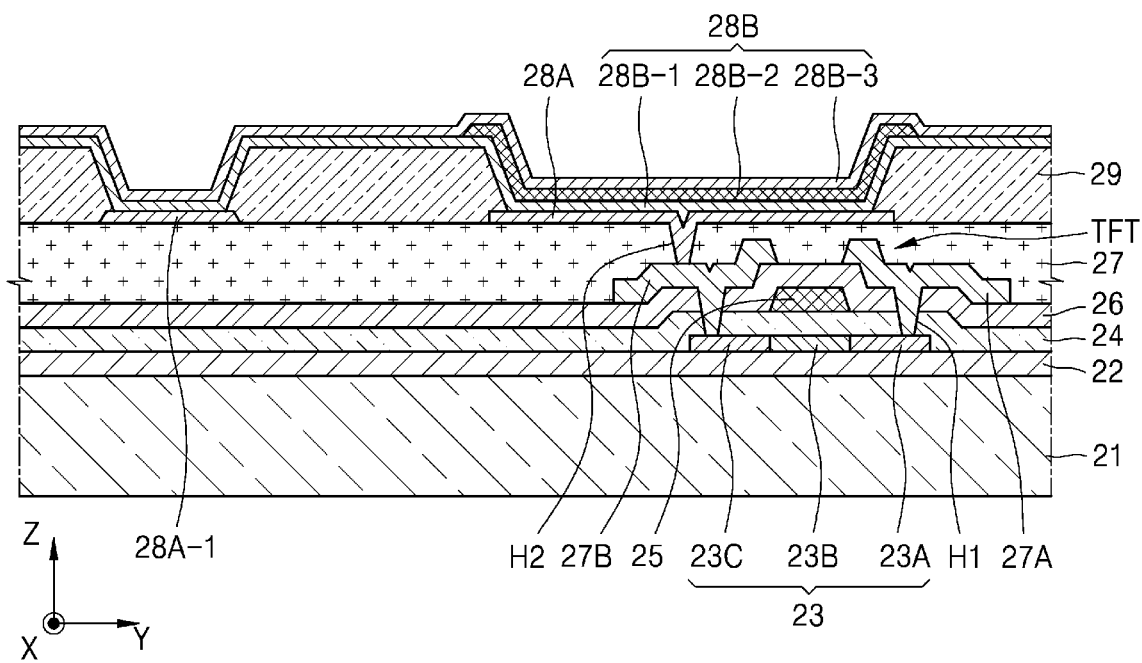
FIGS. 8A, 8B, 8C, 8D, and 8E are cross-sectional views showing a manufacturing sequence of the display device of FIG. 7.

FIG. 8A to FIG. 5E are cross-sectional views showing a manufacturing sequence of the display device 20 of FIG. 7.

Referring to FIG. 8A, the buffer layer 22, the active layer 23, the gate insulating layer 24, the gate electrode 25, the interlayer insulating layer 26, the source electrode 27A, the drain electrode 27B, the passivation film 27, the pixel electrode 28A, the auxiliary electrode 28A-1, the pixel defining layer 29, the first auxiliary layer 28B-1, the organic emission layer 28B-2, the second auxiliary layer 28B-3 may be formed on the substrate 21. In this state, at least one of the first auxiliary layer 28B-1 and the second auxiliary layer 28B-3 may be arranged to shield the auxiliary electrode 28A-1. In other words, at least one of the first auxiliary layer 28B-1 and the second auxiliary layer 28B-3 may be arranged to completely cover the display area DA. In the following description, for convenience of explanation, a case in which the first auxiliary layer 28B-1 and the second auxiliary layer 28B-3 are arranged to completely cover the display area DA is mainly described in detail.

Figure 8B:
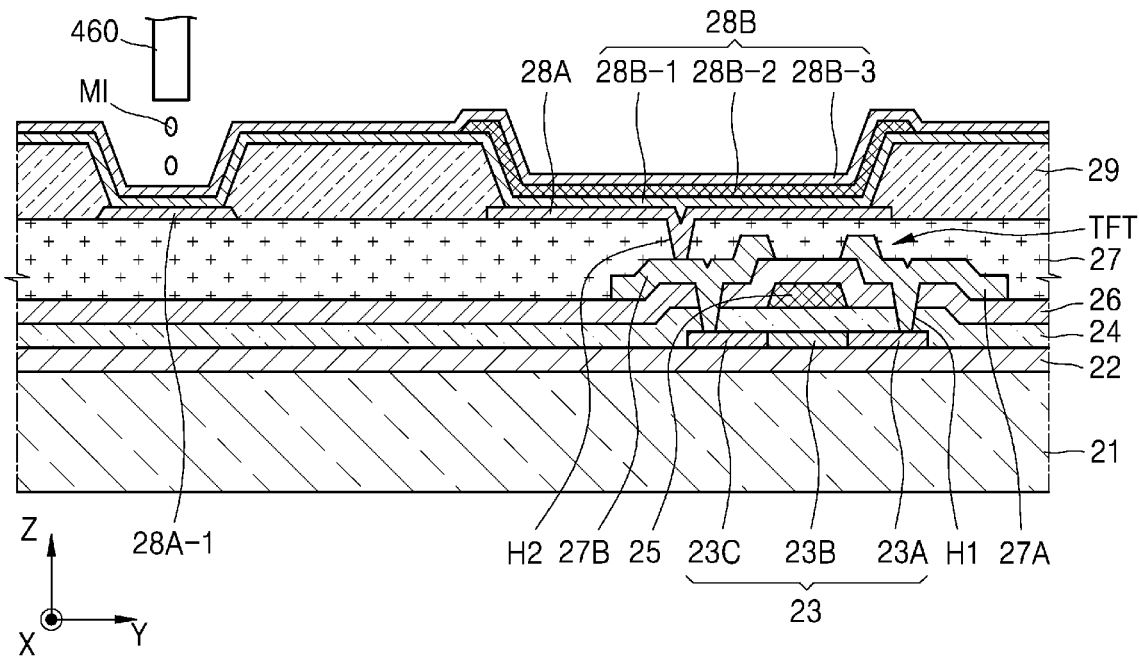

Referring to FIG. 8B, the nozzle portion 460 may eject the metal ink MI onto the second auxiliary layer 28B-3 arranged on the auxiliary electrode 28A-1. In this state, the metal ink MI may include a solvent and at least one of Ag, Al, and Cu.

In the above case, after the mask MS in the form illustrated in FIG. 5B or 6B is arranged, the metal ink MI may be supplied to the second auxiliary layer 28B-3, or without the mask MS, the metal ink MI may be supplied by placing the nozzle portion 460 above the auxiliary electrode 28A-1.

Figure 8C:
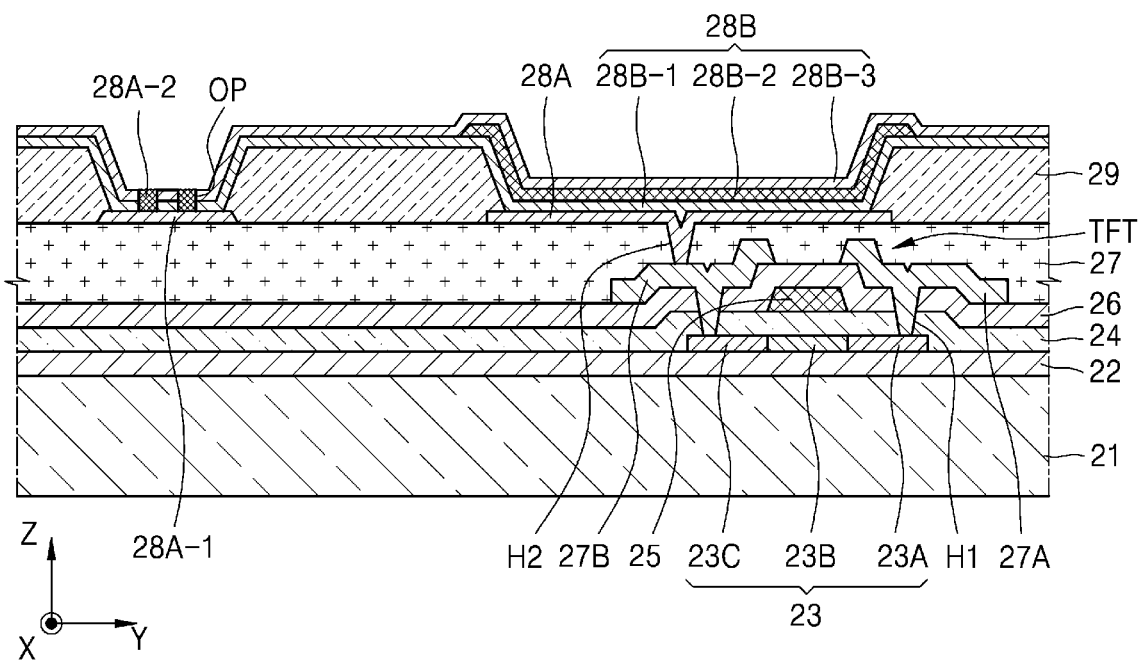

Referring to FIG. 8C, the solvent of the metal ink MI may remove at least parts of the second auxiliary layer 28B-3 and the first auxiliary layer 28B-1, and the metal of the metal ink MI may be inserted between the second auxiliary layer 28B-3 and the first auxiliary layer 28B-1 that are removed. In this state, the solvent of the metal ink MI may be removed through vaporization or heating by maintaining the internal pressure of the chamber 410 at a certain pressure or less, as described above. In particular, when heat is applied, the metal of the metal ink MI may be quickly connected to the auxiliary electrode 28A-1.

Figure 8D:
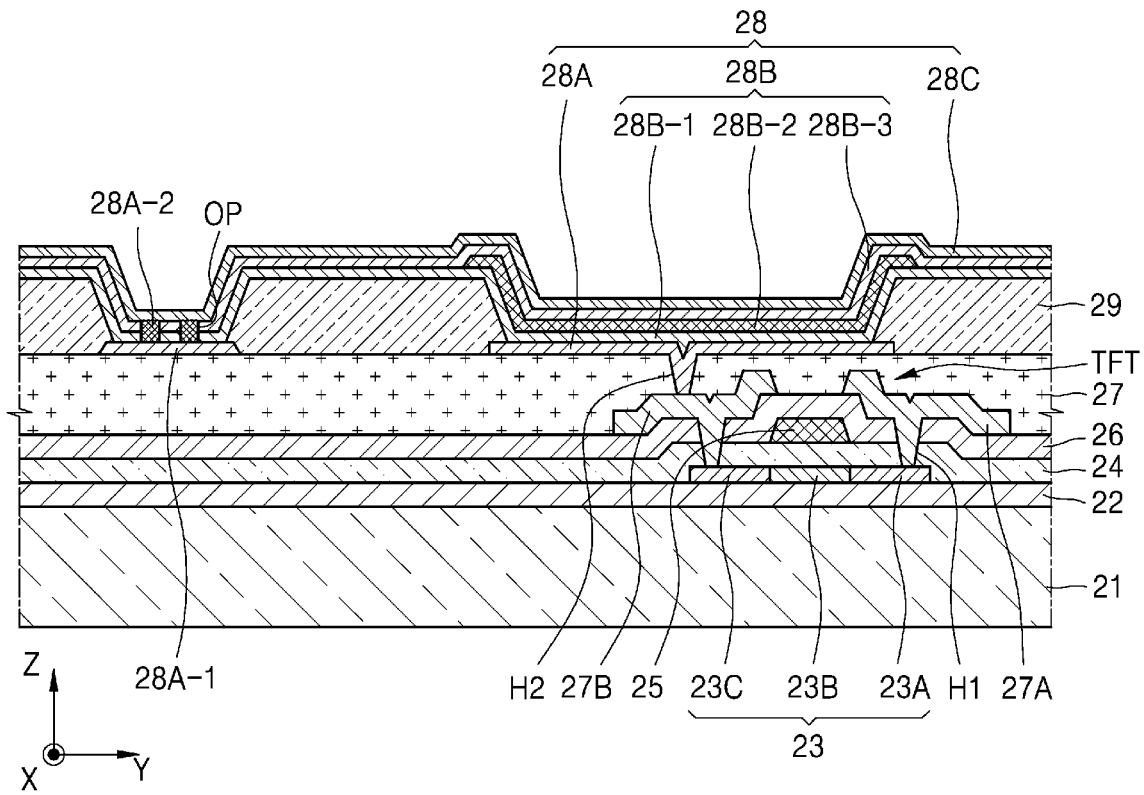

Referring to FIG. 8D, after the bridge portion 28A-2 is formed, the counter electrode 28C may be formed on the second auxiliary layer 28B-3. The counter electrode 28C may be in contact with an upper surface of the bridge portion 28A-2. In this state, the counter electrode 28C may be integrally formed on the entire surface of the display area DA or on the entire surface of the substrate 21.

Figure 8E:
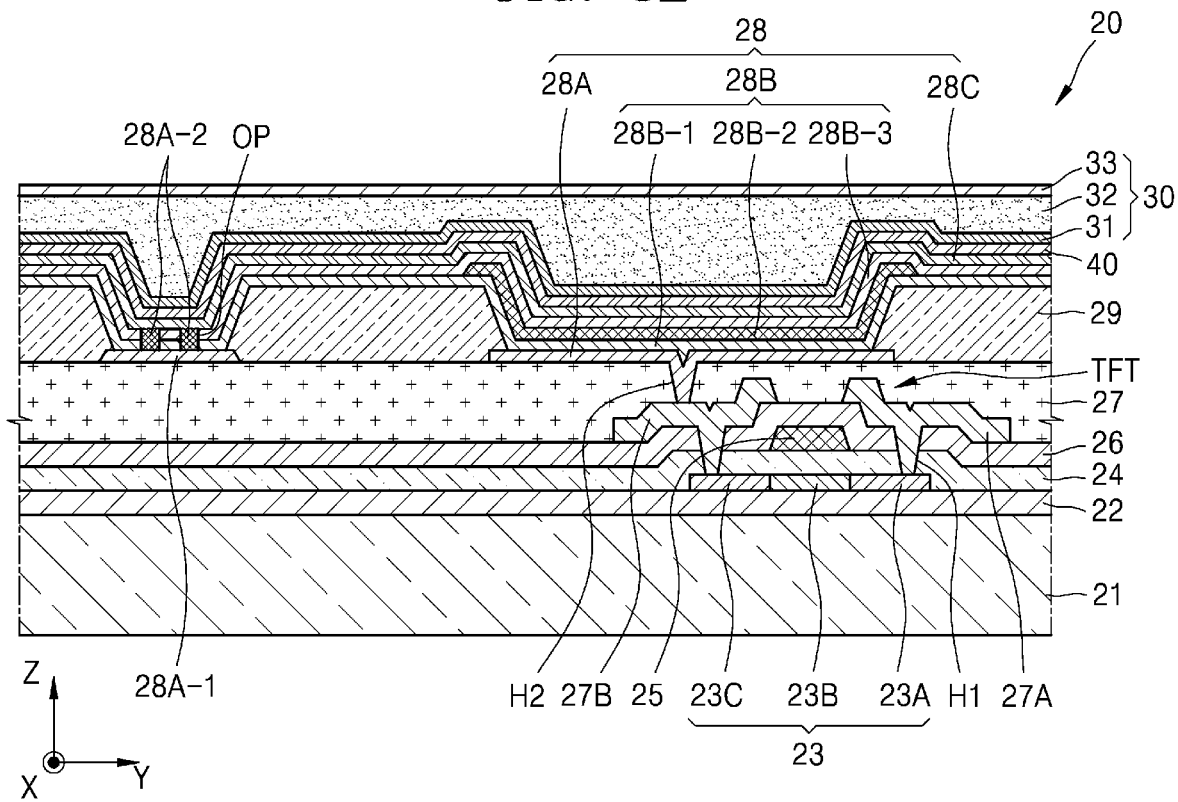

Referring to FIG. 8E, after the counter electrode 28C is formed, the upper layer 40, the first inorganic encapsulation layer 31, the organic encapsulation layer 32, and the second inorganic encapsulation layer 33 may be formed on the counter electrode 28C.

Accordingly, according to a method of manufacturing a display device according to an embodiment, the first auxiliary layer 28B-1 and the second auxiliary layer 28B-3 may be quickly and accurately removed from the auxiliary electrode 28A-1.

In the display device according to the inventive concepts, stable light-emitting is possible in a pixel area.

In the method of manufacturing a display device according to one or more embodiments, the organic material on the auxiliary electrode may be simply and quickly removed.

In the method of manufacturing a display device according to the inventive concepts, the auxiliary electrode may be connected to the electrode.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate;
a first electrode arranged on the substrate;
an auxiliary layer arranged on the first electrode;
an auxiliary electrode arranged on the substrate and spaced apart from the first electrode, the auxiliary electrode and the first electrode being in a same layer;
a second electrode arranged on the auxiliary layer and the auxiliary electrode and connected to the auxiliary electrode; and
a bridge portion arranged on the auxiliary electrode and connecting the auxiliary electrode to the second electrode,
wherein the bridge portion extends through the auxiliary layer in a thickness direction of the display device.

2. The display device of claim 1, further comprising:
an organic emission layer arranged on the first electrode, wherein
the auxiliary layer is arranged on an entire surface of the substrate,
the organic emission layer does not overlap the auxiliary electrode in a plan view, and
the bridge portion and the organic emission layer are spaced apart from each other.

3. The display device of claim 1, wherein
the second electrode is arranged on an entire surface of the substrate, and
the auxiliary layer is selected from at least one of a group consisting of a hole injection layer, a hole transport layer, an electron injection layer, and an electron transport layer.

4. The display device of claim 1, further comprising a pixel defining layer arranged on the substrate, the first electrode, and the auxiliary electrode and comprising an opening portion that exposes each of the first electrode and the auxiliary electrode to an outside.

5. The display device of claim 1, wherein the bridge portion comprises at least one of silver (Ag), aluminum (Al), and copper (Cu).

6. A method of manufacturing a display device, the method comprising:
forming a first electrode and an auxiliary electrode on a substrate;
forming a pixel defining layer on the first electrode and the auxiliary electrode to expose at least part of the first electrode and at least part of the auxiliary electrode on the substrate to outside;
forming an auxiliary layer on the pixel defining layer, the auxiliary electrode, and the first electrode;
arranging a blocking member on the auxiliary layer except the auxiliary layer arranged on the auxiliary electrode, and removing the auxiliary layer arranged on the auxiliary electrode by supplying an etchant, in an inkjet printing method, to the auxiliary layer arranged on the auxiliary electrode.

7. The method of claim 6, wherein the etchant comprises at least one of hydrogen peroxide and sulfuric acid.

8. The method of claim 6, further comprising drying the etchant.

9. The method of claim 6, further comprising removing the etchant by sucking.

10. The method of claim 6, further comprising forming an opening portion in the pixel defining layer to expose the at least part of the first electrode and the at least part of the auxiliary electrode to outside.

11. The method of claim 6, further comprising forming a second electrode on the auxiliary layer to connect the second electrode to the auxiliary electrode.

12. The method of claim 11, wherein the second electrode is formed on an entire surface of the substrate.

13. The method of claim 6, wherein
the first electrode and the auxiliary electrode are formed simultaneously and from a same layer, and
the etchant is supplied through an opening in the blocking member that overlaps the auxiliary electrode in a plan view.

14. A method of manufacturing a display device, the method comprising:
forming a first electrode and an auxiliary electrode on a substrate;
forming a pixel defining layer on the first electrode and the auxiliary electrode to expose at least part of the first electrode and at least part of the auxiliary electrode on the substrate to outside;
forming an auxiliary layer on the pixel defining layer, the auxiliary electrode, and the first electrode; and
forming a bridge portion that penetrate the auxiliary layer arranged on the auxiliary electrode to be connected to the first electrode by supplying metal ink, in an inkjet printing method, to the auxiliary layer arranged on the auxiliary electrode.

15. The method of claim 14, further comprising forming an opening portion in the pixel defining layer to expose the at least part of the first electrode and the at least part of the auxiliary electrode to outside.

16. The method of claim 14, further comprising arranging a blocking member on the auxiliary layer except the auxiliary layer arranged on the auxiliary electrode.

17. The method of claim 14, further comprising forming a second electrode on the auxiliary layer to connect the second electrode to the bridge portion.

18. The method of claim 17, wherein the second electrode is formed on an entire surface of the substrate.

19. The method of claim 14, wherein the metal ink comprises:
a metal particle; and
a solvent in which the metal particle is arranged.

20. The method of claim 19, wherein the metal particle comprises at least one of silver (Ag), aluminum (Al), or copper (Cu).

* * * * *